(12) United States Patent
Zhou et al.

(10) Patent No.: US 9,235,147 B2
(45) Date of Patent: Jan. 12, 2016

(54) ALCOHOL-SOLUBLE HOLE TRANSPORT MATERIALS FOR ORGANIC PHOTOCONDUCTOR COATINGS

(75) Inventors: Zhang-Lin Zhou, Palo Alto, CA (US); Krzysztof Nauka, Palo Alto, CA (US); Lihua Zhao, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/364,994

(22) PCT Filed: Dec. 20, 2011

(86) PCT No.: PCT/US2011/066256
§ 371 (c)(1),
(2), (4) Date: Jun. 12, 2014

(87) PCT Pub. No.: WO2013/095398
PCT Pub. Date: Jun. 27, 2013

(65) Prior Publication Data
US 2014/0322638 A1 Oct. 30, 2014

(30) Foreign Application Priority Data
Dec. 15, 2011 (CN) .............................. 20110420829

(51) Int. Cl.
*G03G 5/07* (2006.01)
*G03G 5/147* (2006.01)
(Continued)

(52) U.S. Cl.
CPC ............ *G03G 5/14717* (2013.01); *G03G 5/047* (2013.01); *G03G 5/05* (2013.01); *G03G 5/0507* (2013.01); *G03G 5/0525* (2013.01); *G03G 5/0532* (2013.01); *G03G 5/0546* (2013.01); *G03G 5/0575* (2013.01); *G03G 5/0592* (2013.01); *G03G 5/0614* (2013.01); *G03G 5/071* (2013.01)

(58) Field of Classification Search
CPC ......... G03G 5/10; G03G 5/04; G03G 5/0614; G03G 5/14704; G03G 5/14791; G03G 5/14708; G03G 5/0517; C08G 79/08; C08G 77/06; C08G 79/02; C08G 63/00; C08G 69/42; C08G 75/00
See application file for complete search history.

(56) References Cited

U.S. PATENT DOCUMENTS 4,871,634 A   10/1989  Limburg
4,990,418 A    2/1991  Mukoh
(Continued)

FOREIGN PATENT DOCUMENTS

EP    1475401 A2    11/2004
JP     09006035     1/1997
(Continued)

OTHER PUBLICATIONS

Suzuki, S. et al., Material Technology for Organic Photoconductors, (Research Paper), Fuji Electric Journal, Jul. 2011, pp. 7-13, vol. 57, No. 1.

(Continued)

*Primary Examiner* — Hoa V Le
(74) *Attorney, Agent, or Firm* — Hewlett-Packard Patent Department

(57) ABSTRACT

An alcohol-soluble organic coating including a hole transport material formed on a surface of organic photoconductor is provided. The coating comprises a cationic alternate fluorene-based copolymer with phosphonium salt terminal groups embedded in an in-situ cross-linked polymer.

15 Claims, 6 Drawing Sheets

(51) Int. Cl.
*G03G 5/05* (2006.01)
*G03G 5/047* (2006.01)
*G03G 5/06* (2006.01)

(56) References Cited

U.S. PATENT DOCUMENTS

| | | |
|---|---|---|
| 5,368,967 A | 11/1994 | Schank |
| 5,709,974 A | 1/1998 | Yuh |
| 5,777,070 A | 7/1998 | Inbasekaran |
| 6,451,493 B1 | 9/2002 | Omokawa |

2008/0299472 A1  12/2008  DeJong

FOREIGN PATENT DOCUMENTS

| | | |
|---|---|---|
| WO | WO-2007131582 A1 | 11/2007 |
| WO | WO-2010028726 A1 | 3/2010 |
| WO | WO-2010046114 A2 | 4/2010 |

OTHER PUBLICATIONS

International Search Report and Written Opinion for PCT/US20110066256 dated Sep. 20, 2012, 9 pp.
European Search Report, issued Jul. 13, 2015, in the related EP application 11878125.1-1303/2795406.

ALCOHOL-SOLUBLE HOLE TRANSPORT MATERIALS FOR ORGANIC PHOTOCONDUCTOR COATINGS

BACKGROUND

An organic photoconductor (OPC) is one of the components in an electrophotographic (EP) printer. A latent image, which is a surface charge pattern, is created on the OPC prior to contact with a development system containing charged marking particles. This is accomplished by uniformly charging the OPC surface, followed by selective illumination that locally generates opposite charges within the bulk of the OPC which then move to the surface and locally neutralize deposited charges. The OPC frequently has two layers: an inner layer for generating charges (charge generation layer—CGL) and an outer layer containing molecular moieties for facilitating charge movement (charge transport layer—CTL). The OPC element must have very uniform and defect-free structural and electrical characteristics. Its usable lifetime is often determined by the occurrence of physical defects introduced by mechanical, physicochemical and electrical interactions between the surface of the CTL and one or more elements of the electrophotographic process (commonly known as "OPC wear-out"). Some of the proposed solutions addressing this issue involve coating the CTL surface with a hard, inorganic film that may significantly raise the OPC cost and introduce other deleterious effects associated with the contamination particles originating from the inorganic coating.

Alternative solutions have proposed coating the OPC with an organic coating having superior damage resistance and electrical properties corresponding to the original OPC. This might be accomplished by using a mixture of damage-resistant polymer (matrix) and molecular moieties (CTM—charge transport material) providing electrical charge conduction, and coating the original OPC with their solvent-based mixture. This solution has not been successful due to a lack of appropriate hole-conducting dopants that can be used with a solvent that does not attack the original OPC. All commonly-available hole-CTMs require solvents that are incompatible with polycarbonate, the matrix component for most of the commercial OPCs.

DETAILED DESCRIPTION

Figure 1:
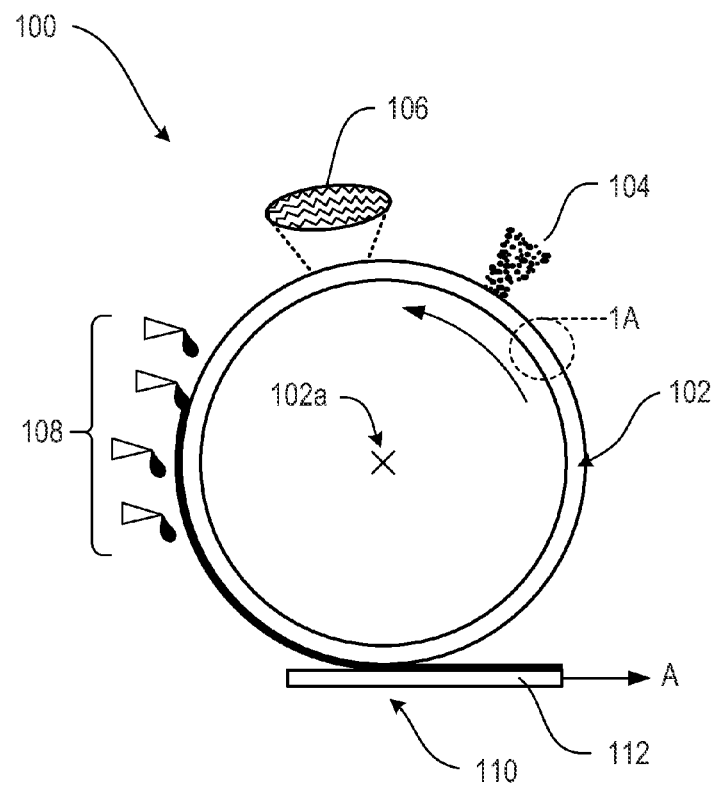
FIG. 1 is a schematic diagram of an apparatus that employs an example organic photoconductor (OPC) drum, in accordance with the teachings herein.

Reference is made now in detail to specific examples, which illustrate the best mode presently contemplated by the inventors for practicing the invention. Alternative examples are also briefly described as applicable.

It is to be understood that this disclosure is not limited to the particular process steps and materials disclosed herein because such process steps and materials may vary somewhat. It is also to be understood that the terminology used herein is used for the purpose of describing particular examples only. The terms are not intended to be limiting because the scope of the present disclosure is intended to be limited only by the appended claims and equivalents thereof.

It is noted that, as used in this specification and the appended claims, the singular forms "a," "an," and "the" include plural referents unless the context clearly dictates otherwise.

As used herein, "about" means a ±10% variance caused by, for example, variations in manufacturing processes.

As used herein, "alkyl" refers to a branched, unbranched, or cyclic saturated hydrocarbon group, which typically, although not necessarily, includes from 1 to 50 carbon atoms, or 1 to 30 carbon atoms, or 1 to 6 carbons, for example. Alkyls include, but are not limited to, methyl, ethyl, n-propyl, iso-propyl, n-butyl, isobutyl, t-butyl, octyl, and decyl, for example, as well as cycloalkyl groups such as cyclopentyl, and cyclohexyl, for example.

As used herein, "aryl" refers to a group including a single aromatic ring or multiple aromatic rings that are fused together, directly linked, or indirectly linked (such that the different aromatic rings are bound to a common group such as a methylene or ethylene moiety). Aryl groups described herein may include, but are not limited to, from 5 to about 50 carbon atoms, or 5 to about 40 carbon atoms, or 5 to 30 carbon atoms or more. Aryl groups include, for example, phenyl, naphthyl, anthryl, phenanthryl, biphenyl, diphenylether, diphenylamine, and benzophenone. The term "substituted aryl" refers to an aryl group comprising one or more substituent groups. The term "heteroaryl" refers to an aryl group in which at least one carbon atom is replaced with a heteroatom. If not otherwise indicated, the term "aryl" includes unsubstituted aryl, substituted aryl, and heteroaryl.

As used herein, "substituted" means that a hydrogen atom of a compound or moiety is replaced by another atom such as a carbon atom or a heteroatom, which is part of a group referred to as a substituent. Substituents include, but are not limited to, for example, alkyl, alkoxy, aryl, aryloxy, alkenyl, alkenoxy, alkynyl, alkynoxy, thioalkyl, thioalkenyl, thioalkynyl, and thioaryl.

The terms "halo" and "halogen" refer to a fluoro, chloro, bromo, or iodo substituent.

As used herein, "alcohol" means a lower alkyl chain alcohol, such as methanol, ethanol, n-propanol, iso-propanol, n-butanol, iso-butanol, tert-butanol, pentanol, hexanol, and their analogs. A fluorinated alcohol is an alcohol having at least one of its alkyl hydrogen atoms replace with a fluorine atom. A perfluorinated alcohol is an alcohol having all of its alkyl hydrogen atoms replaced with fluorine atoms.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

The organic (OPC) in an electrophotographic printer is a thin film photoconductive layer. An electrostatic latent image is formed on the precharged photoreceptor surface via optical exposure. A visual image is obtained after the electrostatic image is developed with charged color toner particles that are subsequently transferred to paper. After the toner is transferred to paper (or other print media), the photoreceptor needs to be cleaned abrasively and corona-charged with ions to get ready for the next imaging process.

An example of an electrophotographic (EP) printer that may employ an organic photoconductor (OPC) is depicted in FIG. 1, which is a schematic diagram of portion of a generic EP printer. An EP printer 100 comprises an OPC drum 102 that is rotatable about an axis 102a. The construction of the OPC drum 102 is described in greater detail below.

As the OPC drum 102 rotates, it passes through several stations, including a charging station 104, an exposure station 106, a development station 108, and a transfer station 110.

At the charging station 104, an electrostatic charge is uniformly distributed over the surface of the OPC drum 102. Charging is typically done by a corona or a charge roller.

At the exposure station 106, also known as the image-forming station, the document to be printed or its image formed on a screen is illuminated and either passed over a lens or is scanned by a moving light and lens, such that its image is projected onto and synchronized with the moving drum surface. Where there is text or image on the document, the corresponding area of the drum remains unlit. Where there is no image, the drum is illuminated and the charge is dissipated. The charge that remains on the drum after this exposure is a "latent" image and is a negative of the original document.

At the development station 108, the drum 102 is presented with toner, e.g., liquid ink, more specifically, black ink in the case of a black ink-only printer and colored inks in the case of a color ink printer. The liquid ink is electrically charged and attracted to areas on the drum bearing complementary electrical charges.

At the transfer station 110, the ink on the drum 102 is transferred to a print medium 112, moving in the direction indicated by arrow A.

Following ink transfer, the drum 102 is prepared for a new imaging cycle.

Figure 1A:
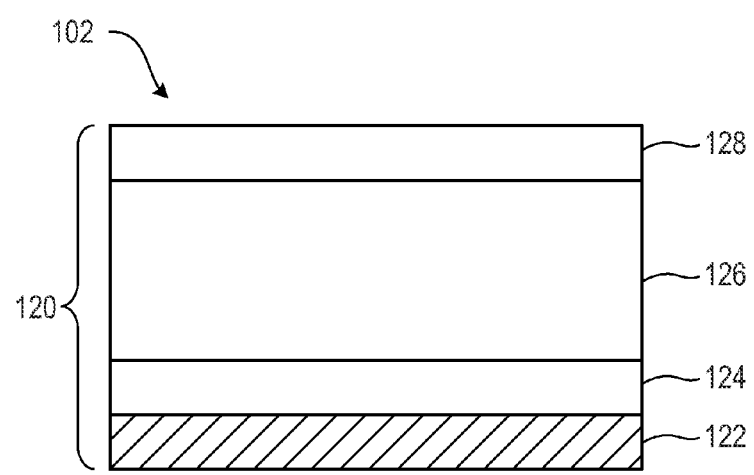
FIG. 1A is an enlargement of a portion of the OPC drum.

FIG. 1A is an enlargement of a portion of the drum 102 of FIG. 1, and depicts an example configuration in accordance with the teachings herein. An OPC 120 comprises a conductive substrate 122, a charge generation layer (CGL) 124, and a charge transport layer (CTL) 126. The thickness of the CTL 126 may be greater than 10 µm. A doped protective coating (DPC) 128 may be formed on the exterior surface of the CTL 126.

The structure of the organic photoreceptor usually has several layers of materials, each of which performs a specific function, such as charge generation, charge transport, and occasionally additional surface protection. These layers are formed by individual sequential coatings. One of these layers is the charge transport material (CTM) layer, or CTL 126. In this regard, mainly aromatic tertiary amino compounds and their corresponding polymers are usually used. Generally, these materials are soluble in common organic solvents such as tetrahydrofuran (THF) and dichloromethane ($CH_2Cl_2$). Because of their solubility in these solvents, there is usually a loss of charge transport material and/or mixing with the material that is over-coated on top for protection. In addition, these materials cannot facilitate "fast" transport of electrical charges, making them irrelevant for the high-speed printing applications, such as digital commercial printing.

In the electrophotographic process, the photoreceptor (belt or cylinder) desirably has very uniform area characteristics: coating uniformity, dark conductivity, and photoconductivity. During each imaging cycle, the OPC surface is subjected to a number of punishing electrochemical and mechanical processes. These include corrosive ozone and oxidative reactions from corona or charge roller charging, abrasive mechanical treatments from toner development, toner transfer to paper, and doctor blade cleaning of the drum and contact with a charge roller. The essential physical properties that dictate the electrophotographic imaging process, such as dark and photo conductivity and electronic defects on the photoreceptor surface, and the like, could accelerate their deterioration under such detrimental conditions. Therefore, it is desirable to develop protective overcoats for the OPCs.

In the case of liquid electrophotography, these processes can be further enhanced by interactions between the solvent (usually a non-polar, isoparaffinic-based mixture) and the polymer constituting the CTL 126. In many cases, solvent penetrates into the CTL 126 through openings caused by the mechanically damaged surface and induces local swelling of the CTL. The damage to the CTL 126 degrades print quality, requiring the OPC to be frequently replaced.

Mechanical damage of the OPC is related to relatively high concentrations of the charge individual molecular conducting moieties (small molecules) that can be as high as 50% of the CTL volume. This high concentration of the charge conducting moieties (CTM) is necessary to achieve the desired CTL electrical conductivity, and it can decrease mechanical strength and damage resistance of the original polymer constituting the CTL. Frequent photoconductor replacement can have a negative impact on the cost of the printing process, which is particularly significant for high speed/large volume printing applications, as in the case of digital commercial printers.

Previous attempts to improve the operational lifetime of the OPC surface region have relied on coating it with a layer of a "hard" inorganic film, such as carbon (e.g., graphite or diamond), silica, etc. This solution is not popular due to the following reasons: a) difficulties in forming such inorganic film on the organic substrate (lack of compatible deposition processes); b) excessively high cost of the inorganic films and their poor reliability; and c) "dust" issues due to the fact that the inorganic coating may "shed" microscopic particles caused by the mechanical interactions with the print engine components and poor adhesion of the inorganic coating to an organic substrate.

On the other hand, the promising results of using organic solvent-based cross-linkable coatings with CTMs to extend the lifetime of OPC have been demonstrated. Their advantage stems from the fact that, due to their superior electrical conductivity, the desired electrical properties of the coating can be achieved at low CTM concentrations without compromising mechanical strength of the layer. However, most of the CTMs can only be dissolved into more aggressive solvents such as toluene, xylenes, THF, chloroform, chlorobenzene, and dichlorobenzene, etc. Unfortunately, all of these solvents can damage the existing CTL 126 in a commercial OPC. Polycarbonates used in the CTL 126 can survive only a few solvents such as alcohols, while essentially all of the commercially-available CTMs have very poor solubility in alcohols. Thus, the development of alcohol-soluble CTMs could permit a solution process to coat the OPC layer without damaging the polycarbonate layer.

In accordance with the teachings herein, the foregoing challenges may be avoided by employing alcohol-soluble hole transport materials and coating the CTL 126 of the OPC with a solvent-based mixture containing monomer moieties which are cross-linked after deposition on the OPC. That is to say, the monomer is cross-linked in-situ on the surface of the OPC to provide the protective coating 128. This approach provides much better adhesion and higher mechanical strength layers than in the case where a previously cross-linked polymer is deposited on the OPC.

In particular, alcohol-soluble coatings that include cationic alternate fluorene-based monomers with phosphonium salt terminal groups may be used to coat the OPC and then cross-linked in-situ to form cationic alternate fluorene-based copolymers with phosphonium salt terminal groups.

The alcohol-soluble CTMs can coat an existing OPC using an alcohol-based solution process with cross-linked polymer films without damaging the existing CTL 126 in the OPC. The corresponding matrix material(s), providing the complete recipe for the protective coating of a polycarbonate-based OPC, are also disclosed herein.

The monomer moieties comprise novel alcohol-soluble charge transport materials (CTMs) that can used for an alcohol-based solution OPC coating process. These alcohol-soluble CTMs are based on cationic alternate fluorene-based copolymers with phosphonium salt terminal groups. More specifically, these alcohol-soluble CTMs are conjugated cationic copolymers that contain a phosphonium salt in the side chain. These conjugated polymers have extremely high solubility in alcohols, thus permitting coating of the OPC using a solution process based on alcohol solvents.

Also disclosed herein is a method of producing such phosphonium salt functionalized alternate fluorene-based copolymers as alcohol-soluble CTMs. These new copolymers have extremely good solubility in polar solvents such as alcohols, which makes them very useful for coating existing OPCs using the alcohol-based solution process without damaging the existing CTL in the OPC. The corresponding matrix material is also disclosed.

An organic photoconductor commonly used in electrophotographic applications is a dual layer structure consisting of a thin (about 0.1 to 2 µm) charge generation (CGL) bottom layer 124 and a thick (about 20 µm) charge transport (CTL) top layer 126. Light passes through the transparent CTL 126 and strikes the CGL 124, generating free electrons and holes. Electrons are collected by the electrical ground of the photoreceptor and holes are driven towards to top of the CTL 126 by an applied electrical field. The CTL 126 provides a mechanism for the hole transport towards the surface, at which they are used to neutralize negative surface ions deposited during the pre-charging process. In essence, the CTL 126 consists of a non-conductive organic material (usually a polymer) with charge transport moieties embedded into it. In most cases, the CTL 126 is made of a non-conductive polycarbonate matrix having charge transport moieties in form of conductive organic small molecules or short chain polymers such as aryl hydrazones, aminoaryl heterocycles such as oxadiazole and especially highly conjugated arylamines.

As a consequence of the teachings herein, the CTL 126 may be coated with a protective film 128 having superior resistance against damage occurring during the printing as further demonstrated in FIG. 5, described in greater detail below. At the same time, the protective film 128 may exhibit electrical behavior that is compatible with the normal operation of the CTL 126. This means that electrical resistivity of the coating 128 must be comparable with the CTL 126 and it needs to remain unchanged or, at least, it needs to change less that the CTL resistivity during the prolonged use of the OPC, as further shown in FIGS. 4 and 6, also described in greater detail below. In an example, the process of coating the photoconductor with a layer consisting of a mechanically "strong" polymer with uniformly embedded charge transfer moieties employs the respective liquid solvent mixture of monomers, oligomers or even polymers mixed with charge transfer species, followed by deposition of the mixture on the photoconductor and, finally, cross-linking of the polymerizable species. The resulting product is a thin protective layer 128, fully mechanically conformal with the photoconductor and containing substantially uniformly distributed charge transfer moieties. The alcohol-soluble CTMs in the protective coating 128 thus formed may enable charge transfer between the outer surface of the coating and the CTL 126.

In another example, this process can be used to form the entire CTL region 126. In this case, a thin solvent mixture layer is deposited on the CGL film 124. The deposition process can be further controlled by using appropriate surfactants improving wetting of the deposition substrate.

The cross-linked inert polymer network may be formed by combining cross-linkable monomer(s), oligomer(s), and polymer(s), in addition to at least one cross-linking agent and at least one initiator, with the fluorene copolymer and the alcohol-based solvent. The cross-linking agent may be a 2-branch, 3-branch, or 4-branch cross-linker that can be initiated with appropriate energy. Either photo-curable (e.g., ultra-violet curable) or thermally-curable resins may be used. The polymer network is formed from the cross-linkable monomer, oligomer, polymer and the cross-linking agent and initiator; the polymer network comprises a matrix in which the CTM, or the cationic alternate fluorene-based copolymer with phosphonium salt terminal groups, is embedded.

The composition of the solution may include:
- 0.1 to 40 wt % cross-linkable monomer, oligomer, polymer;
- 0.1 to 50 wt % cross-linking agent;
- 0.1 to 20 wt % initiator;
- 0.05 to 40 wt % cationic alternate fluorene-based copolymer with phosphonium salt terminal groups; and
- 0.1 to 20 wt % alcohol-based solvent.

An example of the composition forming the polymer network used in the solution may comprise: (A) a polyimide resin having one or more primary alcoholic groups with an alcoholic equivalent equal to or less than 3500, the polyimide being soluble in an organic solvent and having a weight average molecular weight of from 5,000 to 500,000 (cross-linkable monomer, oligomer, polymer); (B) at least one of a condensate of an amino compound modified with formalin or a urea resin with formalin and a phenol compound having, on average, either a methylol group or an alkoxy methylol group (cross-linking agent); and (C) a photo acid generator capable of generating an acid upon irradiation with light of a wavelength of from 240 nm to 500 nm (initiator). In component (B), the amino compound and the urea resin may be modified with formalin. Further, the amino compound and the urea resin may be further modified with an alcohol. For example, a melamine resin, modified with formalin and, in some examples, further modified with alcohol, may be employed in the condensation reaction. Another example of the composition includes a UV or thermal-initiated cross-linking of acrylate monomers and cross linkers.

In another example, a cross-linked polyacrylate network may be formed from a co-monomer mixture comprising a) 5 to 20 wt % of a nitrogen-containing monomer, which serves as hydrophilic monomer as well as chain propagation accelerator; b) 20 to 45 wt % of a two-branch acrylate cross-linking monomer; c) 5 to 20 wt % of a three-branch or four-branch cross-linking monomer to increase cross-linking density; and d) 1 to 10 wt % of a photo or thermal initiator. Yet another example includes the use of a special initiator system comprising of (a) a photo or thermal initiator component and (b) an accelerator component comprising a nitrogen-containing monomer.

Cross-Linkable Monomer, Oligomer, Polymer:

The liquid solvent mixture may include at least one monomer, which may include any of multifunctional acrylates, styrene, divinyl benzene, iso-cyanates, and di-iso-cyanates. Examples of multifunctional acrylates include diacrylates, triacrylates, tetraacrylates, and the like. The liquid solvent mixture may include at least one oligomer. For example, acrylate oligomer CN2930, polyester acrylate oligomer CN2302, acrylated polyester oligomer CN299, difunctional polyether methacrylates, etc. The liquid solvent mixture may include at least one functional polymer. Examples include polyester acrylates and polyethylene glycol acrylates. The liquid mixture may alternatively include at least one oligomer or at least one functionalized polymer. By a "functionalized polymer" is a polymer that can be cross-linked with a cross-linking agent (cross-linker).

Examples of cross-linkable monomers include, but are not limited to, N-alkyl acrylamides, N-aryl acrylamides and N-alkoxyalkyl acrylamides. Specific examples include N-methyl acrylamide, N-ethyl acrylamide, N-butyl acrylamide, N,N-dimethyl acrylamide, N,N-dipropyl acrylamide, N-(1,1,2-trimethylpropyl) acrylamide, N-(1,1,3,3-tetramethylbutyl) acrylamide, N-methoxymethyl acrylamide, N-methoxyethyl acrylamide, N-methoxypropyl acrylamide, N-butoxymethyl acrylamide, N-isopropyl acrylamide, N-s-butyl acrylamide, N-t-butyl acrylamide, N-cyclohexyl acrylamide, N-(1,1-dimethyl-3-oxobutyl) acrylamide, N-(2-carboxyethyl)acrylamide, 3-acrylamido-3-methyl butanoic acid, methylene bisacrylamide, N-(3-aminopropyl)acrylamide hydrochloride, N-(3,3-dimethylaminopropyl)acrylamide hydrochloride, N-(1-phthalamidomethyl)acrylamide, sodium N-(1,1-dimethyl-2-sulfoethyl)acrylamide and the corresponding methacrylamides and combinations of two or more of the above mentioned compounds. Further examples, by way of illustration and not limitation, include N-vinyl amides, for example, N-methyl N-vinyl acetamide, N-vinyl acetamide, N-vinyl formamide and N-vinylmethacetamide; N-vinyl cyclic amides, for example, N-vinylpyrrolidone and N-vinyl-3-morpholinone; heterocyclic vinyl amines, for example, N-vinylpyridine, N-vinyloxazolidines, N-vinylpyrimidine, N-vinylpyridazine, N-vinyl-1,2,4-triazine, N-vinyl-1,3,5-triazine, N-vinyl-1,2,3-triazine, N-vinyl-triazole, N-vinyl-imidazole, N-vinylpyrrole and N-vinylpyrazine; polyethylene glycolated acrylates, for example, polyethylene glycol-di(meth)acrylate, ethylene glycol di(meth)acrylate, triethylene glycol di(meth)acrylate and tetraethylene glycol di(meth)acrylate; polyethylene glycolated methacrylates, for example, methylacrylamide glycolate methylether, polyethylene glycol mono(meth)acrylate, methoxypolyethylene glycol mono(meth)acrylate, octoxypolyethylene glycol mono (meth)acrylate and stearoxypolyethylene glycol mono(meth) acrylate; and combinations of two or more of the above mentioned compounds. Further examples, by way of illustration and not limitation, include cationic monomers, for example, N,N-dimethylaminoethyl methacrylate, N,N-dimethyl-aminoethyl acrylate, N,N-dimethylaminopropyl methacrylate, N,N-dimethylaminopropyl acrylate, N,N-dimethylacrylamide, N,N-dimethylmethacrylamide, N,N-dimethylaminoethylacrylamide, N,N-dimethylaminoethylmethacrylamide, N,N-dimethylaminopropylacrylamide, and N,N-dimethylaminopropyl-methacrylamide.

Cross-Linking Agent:

The cross-linking agent may be a 2-branch (e.g., two functionalities), 3-branch (e.g., three functionalities), or 4-branch (e.g., four functionalities) cross-linker that can be initiated with appropriate energy provided by light (UV) or heat. Both photo-curable and thermally-curable formulations have been employed in the practice of the invention.

Examples of polyfunctional cross-linking agents, by way of illustration and not limitation, include multifunctional acrylates such as diacrylates, triacrylates, tetraacrylates, and the like. In some examples, the multifunctional acrylates may include a portion or moiety that functions as a polymer precursor as described hereinbelow. Examples of multifunctional acrylate monomers or oligomers that may be employed as the polyfunctional cross-linking agent (some of which may include a polymer precursor moiety) in the present embodiments, by way of illustration and not limitation, include diacrylates such as propoxylated neopentyl glycol diacrylate (available from Atofina Chemicals, Inc., Philadelphia Pa., as Sartomer SR 9003), 1,6-hexanediol diacrylate (available from Sartomer Company, Inc., Exton, Pa., as Sartomer SR 238), tripropylene glycol diacrylate, di-propylene glycol diacrylate, aliphatic diacrylate oligomer (available from Atofina as CN 132), aliphatic urethane diacrylate (available from Atofina as CN 981), and aromatic urethane diacrylate (available from Atofina as CN 976), triacrylates or higher functionality monomers or oligomers such as amine modified polyether acrylates (available from BASF Corporation as PO 83 F, LR 8869, or LR 8889), trimethylol propane triacrylate (Sartomer SR 351), tris(2-hydroxy ethyl) isocyanurate triacrylate (Sartomer SR 368), aromatic urethane triacrylate (CN 970 from Atofina), dipentaerythritol penta-/hexa-acrylate, pentaerythritol tetraacrylate (Sartomer SR 295), ethoxylated pentaerythritol tetraacrylate (Sartomer SR 494), and dipentaerythritol pentaacrylate (Sartomer SR 399), or mixtures of any of the foregoing. Additional examples of suitable cross-linking additives include chlorinated polyester acrylate (Sartomer CN 2100), amine modified epoxy acrylate (Sartomer CN 2100), aromatic urethane acrylate (Sartomer CN 2901), and polyurethane acrylate (Laromer LR 8949 from BASF).

Other examples of polyfunctional cross-linking agents include, for example, end-capped acrylate moieties present on such oligomers as epoxy-acrylates, polyester-acrylates, acrylate oligomers, polyether acrylates, polyether-urethane acrylates, polyester-urethane acrylates, and polyurethanes end-capped with acrylate moieties such as hydroxyethyl acrylate. Further, the polyurethane oligomer can be prepared utilizing an aliphatic diisocyanate such as hexamethylene diisocyanate, cyclohexane diisocyanate, diisocyclohexylmethane diisocyanate, isophorone diisocyanate, for example. Other examples include isophorone diisocyanate, polyester polyurethane prepared from adipic acid and neopentyl glycol, for example. Specific examples of polyfunctional cross-linking agents that include isocyanate functionalities and acrylate functionalities include materials sold by Sartomer Company such as, for example, CN966-H90, CN964, CN966, CN981, CN982, CN986, Pro1154, and CN301. Yet other examples of UV-curable or thermally-curable materials that can be used for the polymer matrix with CTMs include those commercially available optical adhesives and electric adhesives from Norland Products such as NOA 60, NOA 61, NOA 63, NOA 65, NOA 68, NOA 68T, NOA 71, NOA 72, NOA 74, NOA 75, NOA 76, NOA 78, NOA 81, NOA83H, NOA 84, NOA 85, NOA 86, NOA 87, NOA 88, NOA 89, NOA 148 AND NOA 1625, NEA 121, NEA 123, NEA 123HGA, NEA 123 K, NEA 123L, NEA 123LHGA, NEA 123M, NEA 123S, NEA 123T, NEA 123THGA, NEA 123TKHGA, NEA 155, NCA 130, NBA 107, NBA 108.

Initiator:

The liquid solvent mixture further may include at least one initiator which may be activated by photo (UV) or thermal energy.

Examples of suitable photo initiators include 2,4,6-trimethyl-benzoyldiphenylphosphine oxide (available as BASF Lucirin TPO), 2,4,6-trimethyl-benzoylethoxyphenylphosphine oxide (available as BASF Lucirin TPO-L), bis(2,4,6-trimethylbenzoyl)-phenyl-phosphine oxide (available as Ciba IRGACURE 819) and other acyl phosphines, 2-benzyl 2-dimethylamino 1-(4-morpholinophenyl)butanone-1 (available as Ciba IRGACURE 369), titanocenes, and isopropylthioxanthone, 1-hydroxy-cyclohexylphenylketone, benzophenone, 2,4,6-trimethylbenzophenone, 4-methyl-benzophenone, 2-methyl-1-(4-methylthio)phenyl-2-(4-morphorlinyl)-1-propanone, diphenyl-(2,4,6-trimethylbenzoyl)phosphine oxide, 2,4,6-trimethylbenzoylphenyl-phosphinic acid ethyl ester, oligo-(2-hydroxy-2-methyl-1-(4-(1-methylvinyl)phenyl) propanone), 2-hydroxy-2-methyl-1-phenyl-1-propanone, benzyl-dimethylketal, t-butoxy-3,5,3-trimethylhexane, benzophenone, 2-hydroxy-2-methyl-1-phenyl-1-propanone, anisoin, benzil, camphorquinone, 1-hydroxycyclohexylphenyl ketone, 2-benzyl-2-dimethylamino-1-(4-morph-olinophenyl)-butan-1-one, 2,2-dimethoxy-2-phenylacetophenone, 2-methyl-1-[4-(methylthio)phenyl]-2-(4-morpholinyl)-1-propanone, and mixtures or two or more of the above. Also included are amine synergists such as, for example, ethyl-4-dimethylaminobenzoate and 2-ethylhexyl-4-dimethylamino benzoate. This list is not exhaustive and any known photopolymerization initiator that initiates a free radical reaction upon exposure to a desired wavelength of radiation such as UV light may be used. Combinations of one or more of the above may also be employed in some examples.

Examples of suitable thermal initiators include organic peroxides, azo compounds and inorganic peroxides. Illustrative examples of organic peroxides include diacyl peroxide, peroxycarbonate, and peroxyester. In some examples, the organic peroxide may be a radical initiator such as isobutyl peroxide, lauroyl peroxide, stearyl peroxide, succinic acid peroxide, di-n-propyl peroxydicarbonate, diisopropyl peroxydicarbonate, or bis(4-tert-butylcyclohexyl)peroxydicarbonate. Examples of the inorganic initiators may include ammonium persulfate, sodium persulfate, and potassium persulfate. Combinations of two or more of the above may also be employed.

Alcohol:

The alcohols that can used for OPC coating include common alcohols and perfluoro alcohols, or mixture of an alcohol and perfluoro alcohol, which include, but not limited to methanol, ethanol, propanol, iso-propanol, butanol, 2-butanol, tert-butanol, pentanol, hexanol, trifluoromethanol, pentafluoroethanol, perfluoro isopropanol, and the like.

Fluorene-Based Copolymer:

Turning now to such novel alcohol-soluble charge transport materials (CTMs), also termed "dopants", several variations are now described. Schemes 1-7 below each describe a general example of this type of alcohol-soluble CTMs based on fluorene copolymers with phosphonium salt terminal groups and substituted aromatic derivatives. Examples of the substituted aromatic derivatives include, but are not limited to, dialkyl substituted fluorene derivatives; substituted carbazole derivatives; substituted benzothiadiazole derivatives; substituted phenothiazine derivatives; substituted 2,7-diaminocarbazole derivatives; substituted 1,4-diphenylaminobenzene derivatives; and substituted bisphenylbenzidine derivatives.

Scheme 1

Fluorene Copolymers with Phosphonium Salt Terminal Groups and Dialkyl Substituted Fluorene Derivatives

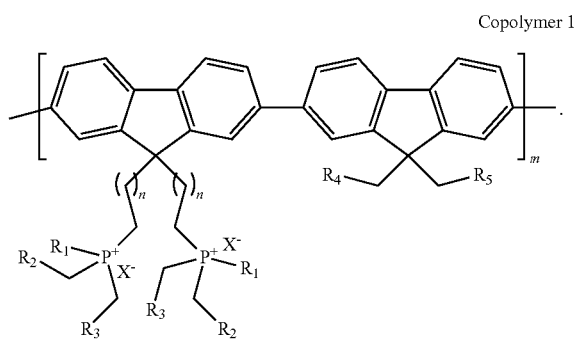

Copolymer 1

Scheme 2

Fluorene Copolymers with Phosphonium Salt Terminal Groups and Substituted Carbazole Derivatives

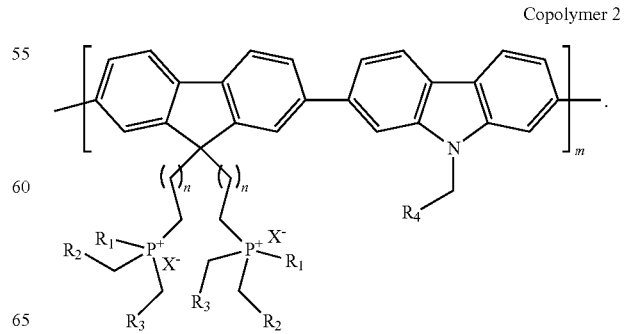

Copolymer 2

Scheme 3

Fluorene Copolymers with Phosphonium Salt Terminal Groups and Substituted Benzothiadiazole Derivatives

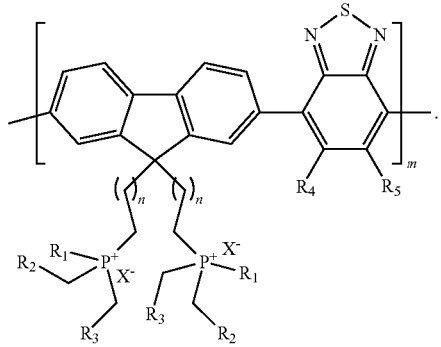

Copolymer 3

Scheme 4

Fluorene Copolymers with Phosphonium Salt Terminal Groups and Substituted Phenothiazine Derivatives

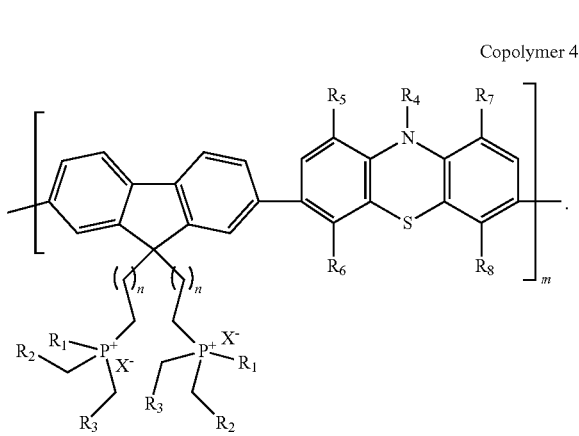

Copolymer 4

Scheme 5

Fluorene Copolymers with Phosphonium Salt Terminal Groups and Substituted 2,7-Diaminocarbazole Derivatives

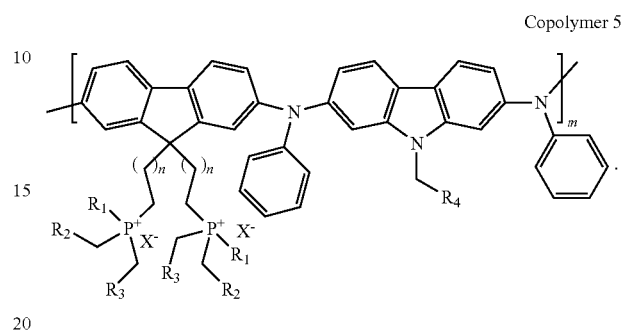

Copolymer 5

Scheme 6

Fluorene Copolymers with Phosphonium Salt Terminal Groups and Substituted 1,4-Diphenylaminobenzene Derivatives

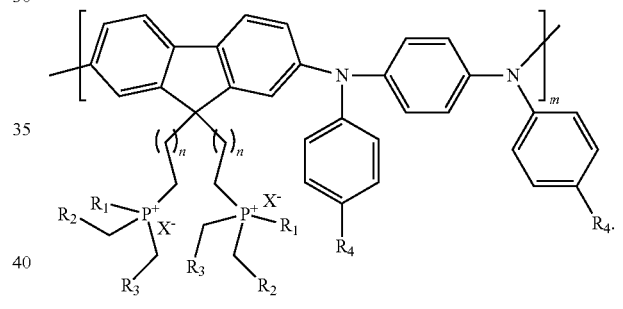

Copolymer 6

Scheme 7

Fluorene Copolymers with Phosphonium Salt Terminal Groups and Substituted Bisphenylbenzidine Derivatives

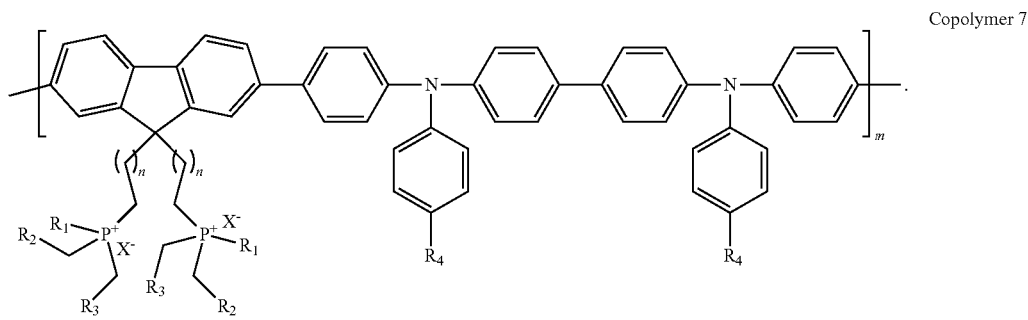

Copolymer 7

In each of Schemes 1-7, $R_1$, $R_2$, $R_3$, $R_4$, and $R_5$ are each independently selected from the group consisting of C1-C30 alkyl, C1-C30 alkenyl, C1-C30 alkynyl, C1-C30 aryl, C1-C30 alkoxy, C1-C30 phenoxy, C1-C30 thioalkyl, C1-C30 thioaryl, C(O)OR$_6$, N(R$_7$)(R$_8$), C(O)N(R$_9$)(R$_{10}$), F, Cl, Br, NO$_2$, CN, acyl, carboxylate and hydroxy, wherein R$_6$, R$_7$, R$_8$, R$_9$ and R$_{10}$ are each independently selected from the group consisting of hydrogen, C1-C30 alkyl and C1-C30 aryl, and so forth. $R_1$, $R_2$, $R_3$, $R_4$, $R_5$, $R_6$, $R_7$, $R_8$ and $R_9$ may be the same or different.

The letter n is an integer between 1 and 30.

The letter m is an integer between 1 and 5,000.

The letter X represents any anion such as Br$^-$, Cl$^-$, I$^-$, tetrafluoroborate, tetraphenyl borate, and the like.

The synthesis of alcohol-soluble CTM copolymer 1 shown in Scheme 8 is representative for this type of polymers. Reaction of commercially-available 2,7-dibromofluorene monomer 1 with large excess of alkyl dihalides 2 gives substituted monomer 3. Reaction of monomer 3 with trialkylphosphine 4 results in monomer 5. Coupling reaction of monomer 5 with monomer 6 (a substituted fluorene diborate) in the presence of a palladium catalyst gives the desired alcohol-soluble CTM copolymer 1 (from Scheme 1).

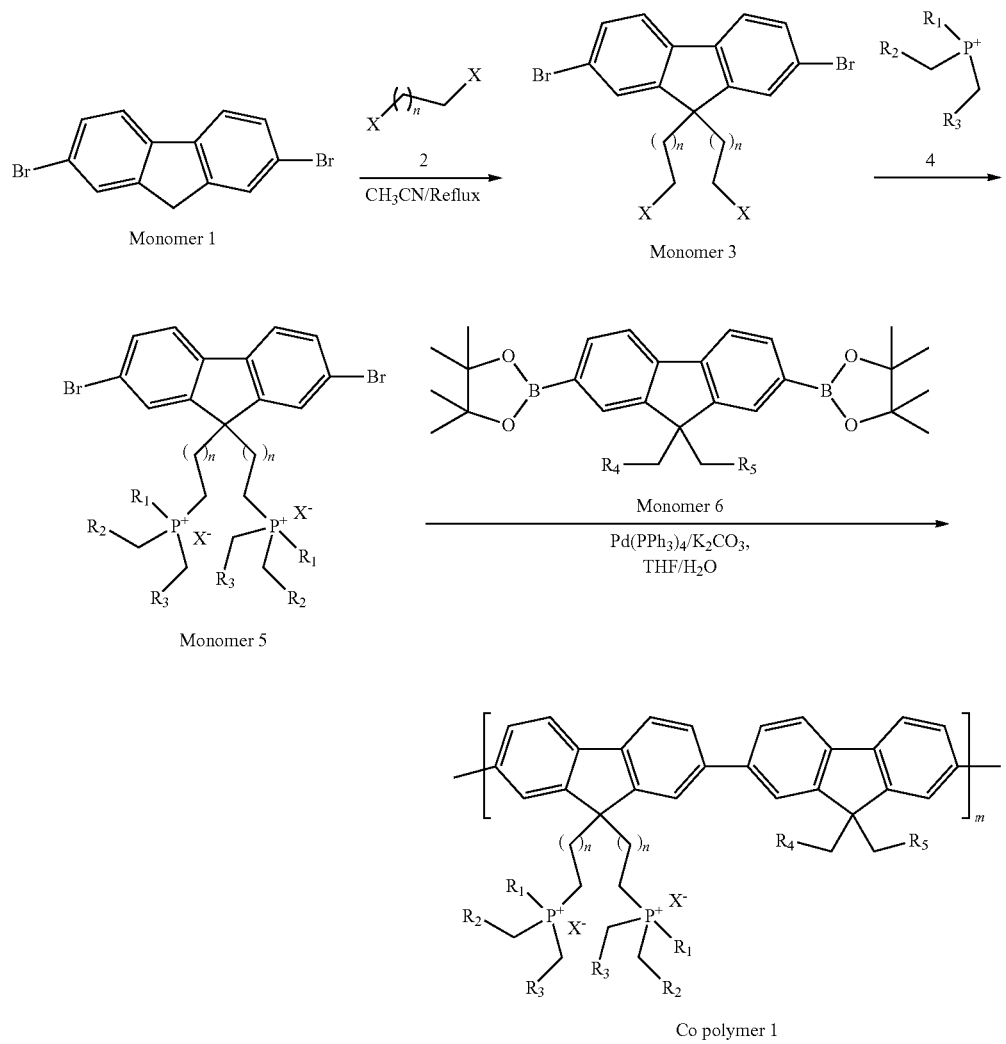

Scheme 8

In the foregoing reaction Scheme 8, $R_1$, $R_2$, $R_3$, $R_4$ and $R_5$ are each independently selected from the group consisting of C1-C30 alkyl, C1-C30 alkenyl, C1-C30 alkynyl, C1-C30 aryl, C1-C30 alkoxy, C1-C30 phenoxy, C1-C30 thioalkyl, C1-C30 thioaryl, C(O)OR$_6$, N(R$_7$)(R$_8$), C(O)N(R$_9$)(R$_{10}$), F, Cl, Br, NO$_2$, CN, acyl, carboxylate and hydroxy, wherein R$_6$, R$_7$, R$_8$, R$_9$ and R$_{10}$ are each independently selected from the group consisting of hydrogen, C1-C30 alkyl and C1-C30 aryl, and so forth. The residues $R_1$, $R_2$, $R_3$, $R_4$, $R_5$, $R_6$, $R_7$, $R_8$ and $R_9$ may or may not be identical.

The letter n represents any integers between 1 and 30.

The letter m represents integers between 1 and about 5,000.

The letter X represents any anion such as Br$^-$, Cl$^-$, I$^-$, tetrafluoroborate, tetraphenyl borate, etc.

Similarly, as depicted in Scheme 9 below, a coupling reaction of monomer 5 (from Scheme 8 above) with 2,7-diminocarbazole monomer 7 in the presence of palladium catalyst and strong base such as sodium tert-butoxide gives the desired alcohol-soluble CTM copolymer 5 (from Scheme 5).

Scheme 9

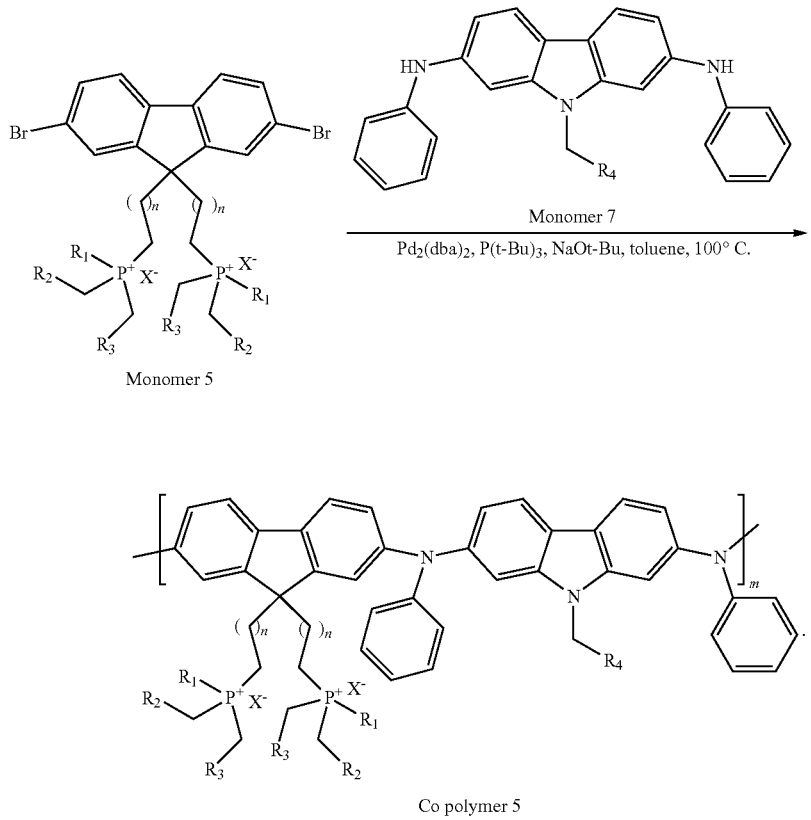

Formation of Protective Layer 128:

The liquid solution may be formed by combining the various components (cross-linkable monomer, oligomer, polymer plus cross-linking agent, initiator, fluorene copolymer, and alcohol solvent. The liquid solution may then be applied to the OPC, forming a thin, substantially uniform coating (with the help of one or more surfactants), and the solvent allowed to evaporate. In some examples, the coating 128 may be less than about 2 μm, while in other examples, somewhat thicker coatings with a high enough electrical conductivity and charge mobility may be employed. Finally, the polymerizable components of the liquid mixture are cross-linked in-situ, forming a strong, mechanically conformal protective coating consisting of a polymer thin layer matrix with a uniformly distributed added species (charge transport moieties, namely, the fluorene copolymer).

There are various methods in which the surface of OPC may be covered with the thin layer of the cross-linked polymer with the fluorene copolymer hole-transport material embedded into it. This may be accomplished by coating the OPC with a thin film liquid formulation including a monomer, a hole-transport material (dopant), an initiator, a cross-linker, and wetting agents, including solvent. For example, the liquid formulation may be sprayed onto the surface of OPC and a blade, such as a plastic blade, may be used to achieve the desired uniform thickness of the liquid film. Alternatively, a uniformly thick liquid layer may be applied with a roller.

After solvent evaporation, the monomer coating may be polymerized in-situ by applying UV illumination or heat, depending on the type of initiator used.

Alternatively, polymerization may be accomplished by mounting the photoconductor in a press and commencing printing. UV and heat exposure during the printing process (especially in the case of using a charge roller that produces copious amounts of UV radiation) is sufficient to complete polymerization within the first few tens to hundreds of printed pages.

A combination of partial polymerization before mounting the photoconductor in a press followed by continuation of the polymerization during press operation may also be used.

In any event, the polymerization may be performed in air or in an inert ambient environment.

Controlled polymerization (by varying time, UV exposure or temperature) can be used to tune the mechanical strength of a protective layer. Further control of this parameter can be achieved by introducing additional mechanically resistant additives into deposited liquid formulation. Desired electrical conductivity within the protective film can be achieved by detailed control of the monomer-to-hole transport material ratio in the mixture.

Precise control of the layer thickness is achieved by adjusting the solvent-to-matrix polymer species ratio in the mixture before deposition with a given coating technique (for a given thickness of the deposited liquid film, a higher solvent-to-polymer ratio means thinner final coating). The polymer concentration may be in a range of about 0.1 to 10 wt % in some examples and about 0.25 to 2 wt % in other examples. Similarly, a larger ratio of the charge transport materials to the matrix polymer species may result in a higher electrical conductivity of the final coating. The dopant (charge transport material) concentration in the solvent may be in a range of about 0.05 to 0.5 wt % in some examples and about 0.075 to 0.25 wt % in other examples.

EXAMPLES

Example 1

Preparation of 2,7-Dibromofluorene (Compound 2)

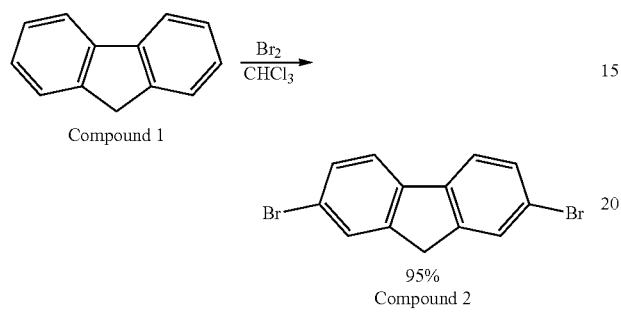

To a solution of fluorene (Compound 1) (30 g, 0.18 mol) and CHCl$_3$ (250 mL), liquid bromine (72 g, 0.45 mol) was added drop by drop under ice-bar, the reaction mixture was stirred for 24 h. 50% NaOH aqueous solution was added to remove excess bromine. The separated organic layer was washed with brine and dried over anhydrous Na$_2$SO$_4$ and chloroform was evaporated under vacuum. The crude product was purified by recrystallization from chloroform to give Compound 2 as a white solid (55.4 g, 95%). $^1$H NMR (300 MHz, CDCl$_3$, ppm): δ 7.43-7.61 (m, 6H), 3.76 (s, 2H). $^{13}$C NMR (75 MHz, CDCl$_3$, ppm): δ 144.9, 139.3, 130.3, 128.4, 121.3, 121.1, 36.7. MS m/z: 324 (M$^+$).

Example 2

Preparation of 2,7-Dibromo-9,9-bis(6'-bromopropyl)fluorene (Compound 3)

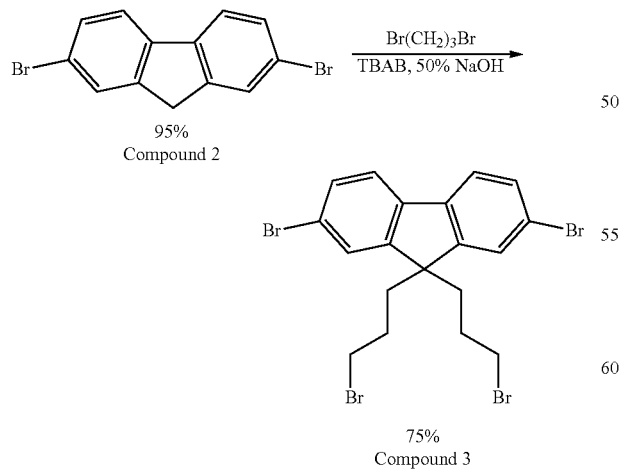

A mixture of 2,7-dibromofluorene (Compound 2 from Example 1) (4.86 g, 15 mmol), 1,4-dibromopropane (30 mL), tetrabutylammonium bromine (0.1 g), and aqueous sodium hydroxide (30 mL, 50% w/w) solution was stirred overnight at 70° C. under nitrogen. After diluting the reaction mixture with chloroform, the organic layer was washed with brine and water. The separated organic layer was dried over anhydrous Na$_2$SO$_4$ and chloroform was evaporated under vacuum. The excess 1,6-dibromopropane was distilled under vacuum. 9,9-bis(6'-bromopropyl)fluorene (Compound 3) (7.3 g, 75%) was obtained as a white crystal by chromatography with petroleum ether as the eluent. $^1$H NMR (300 MHz, CDCl$_3$, ppm): δ 7.43-7.56 (m, 6H), 3.28-3.33 (t, 4H, J=6.6 Hz), 1.89-1.95 (m, 4H), 0.53-0.63 (m, 4H). $^{13}$C NMR (75 MHz, CDCl$_3$, ppm): δ 152.3, 139.2, 130.5, 126.3, 121.7, 121.4, 55.7, 40.2, 27.9, 23.6.

Example 3

Preparation of (3,3'-(2,7-Dibromo-9H-fluorene-9,9-diyl)bis(propane-3,1-diyl))bis(tributylphosphonium) bromide (Compound 4)

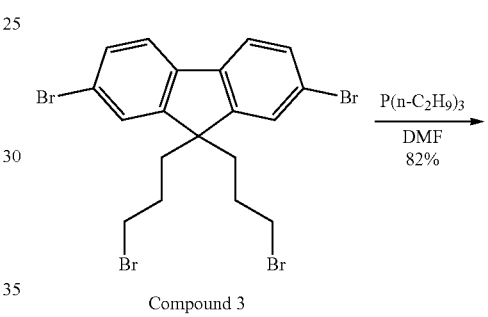

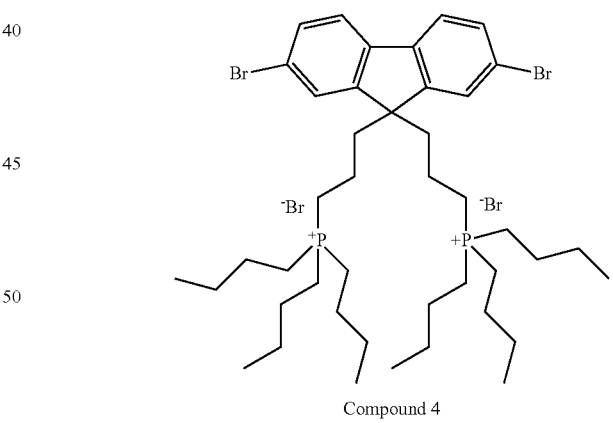

A solution of compound 3 (from Example 2) (5.6 g, 10 mmol) and P(n-C$_4$H$_9$)$_3$ (5.05 g, 25 mmol) in 40 mL of DMF was heated to reflux overnight. After removal of the solvents under reduced pressure, the residue was purified by crystallization with acetone and ethyl acetate to give Compound 4 as a white solid (7.83 g, 82%). $^1$H NMR (400 MHz, CDCl$_3$, ppm): δ 7.79 (s, 2H), 7.56-7.59 (d, 2H), 7.50-7.52 (d, 2H), 2.36-2.41 (t, 4H), 1.40-1.50 (m, 28H), 0.91-0.95 (t, 18H).

Anal. Calcd. for $C_{43}H_{72}Br_4P_2$: C, 53.21; H, 7.48 Found: C, 53.21; H, 7.36. ESI (m/z): [M−Br]: m/z 887.

Example 4

Preparation of 2,7-Bis(4,4,5,5-tetramethyl-1,3,2-dioxaborolan-2-yl)-9,9-dihexylfluorene (Compound 7)

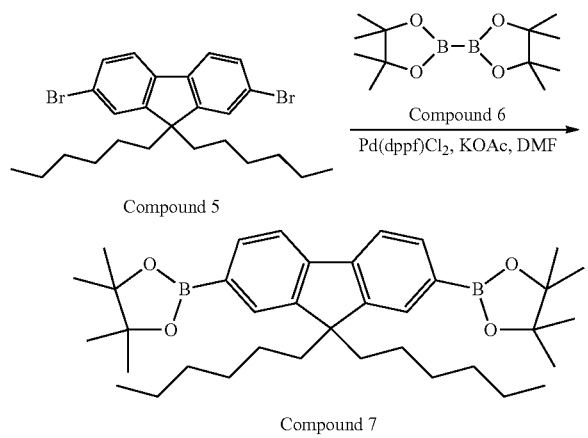

A mixture of 2,7-dibromo-9,9-dihexylfluorene (Compound 5) (15 g, 30.5 mmol), KOAc (18 g, 183 mmol), bis(pinacolato)diborane (Compound 6) (16.4 g, 64 mmol), Pd(dppf)Cl$_2$ (1.8 g, 0.22 mmol) in 150 mL of degassed 1,4-dioxane was stirred for 12 h at 80° C. After the mixture was cooled to room temperature, water and chloroform were added into the mixture, and the separated organic layer was washed with brine, water and dried over anhydrous Na$_2$SO$_4$. After removal of the solvent under reduced pressure, the residue was purified over silica gel column chromatography with petroleum as the eluent to give the product as a white solid (13.4 g, 75%). $^1$H NMR (300 MHz, CDCl$_3$, ppm): δ 7.70-7.81 (m, 6H), 1.39 (s, 24H), 1.01-1.11 (m, 12H), 0.72-0.76 (t, 6H, J=6.9 Hz).

Example 5

Preparation of Alcohol-Soluble CTM (Copolymer P1)

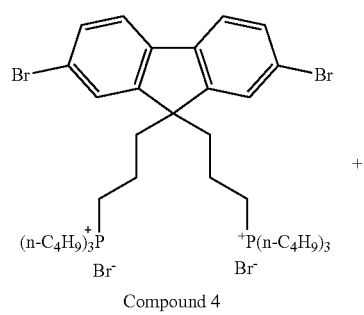

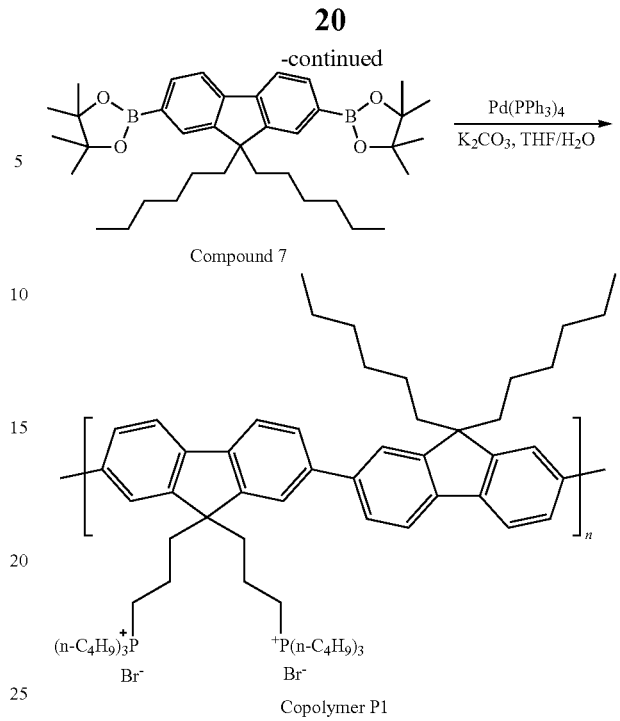

Compound 4 (from Example 3) (500 mg, 0.52 mmol), Compound 7 (from Example 4) (302 mg, 0.52 mmol), Pd(PPh$_3$)$_4$ (12 mg, 0.02 mmol), and 0.83 g of K$_2$CO$_3$ were added into a two-neck flask and degassed by N$_2$, then degassed THF (8 mL) and deionized water (4 mL) were injected by syringe. The reaction mixture was stirred under nitrogen purge at 85° C. for 48 h. After cooling to room temperature, water and chloroform were added, the separated organic layer was washed with brine and water and then dried over anhydrous Na$_2$SO$_4$. After removal of the solvent under reduced pressure, the residue was added to stirred petroleum ether to give a precipitate. The precipitate was dissolved in chloroform and reprecipitated from petroleum ether. The resulting precipitate was placed in a Soxhlet apparatus and extracted with refluxed ethyl acetate for 48 h to remove small molecules and catalyst residue, and then was dried at 60° C. in vacuum oven to give Copolymer P1 as a yellow solid. $^1$H NMR (300 MHz, CD$_3$OD, ppm): δ 7.58-8.01 (m, 12H), 1.80-2.13 (m, 17H), 0.79-1.72 (m, 86H).

Example 6

Preparation of Alcohol-Soluble CTM (Copolymer P2)

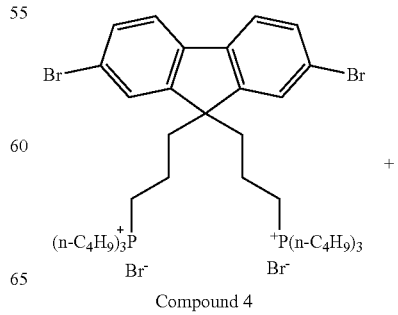

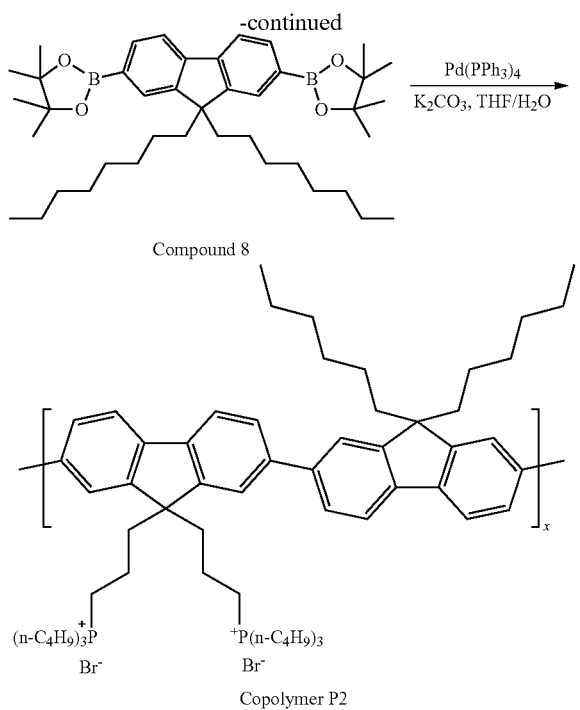

Compound 8

Copolymer P2

Compound 4 (from Example 3) (500 mg, 0.52 mmol), Compound 8 (334 mg, 0.52 mmol) (Compound 8 is available from TCI America, Portland, Oreg.)), Pd(PPh$_3$)$_4$ (12 mg, 0.02 mmol), and 0.83 g of K$_2$CO$_3$ were added into a two-neck flask and degassed by N$_2$, then degassed THF (8 mL) and deionized water (4 mL) were injected by syringe. The reaction mixture was stirred under nitrogen purge at 85° C. for 48 h. After cooling to room temperature, water and chloroform were added, the separated organic layer was washed with brine and water and then dried over anhydrous Na$_2$SO$_4$. After removal of the solvent under reduced pressure, the residue was added to stirred petroleum ether to give a precipitate. The precipitate was dissolved in chloroform and reprecipitated from petroleum ether. The resulting precipitate was placed in a Soxhlet apparatus and extracted with refluxed ethyl acetate for 48 h to remove small molecules and catalyst residue, and then was dried at 60° C. in vacuum oven to give Copolymer P2 as a yellow solid. $^1$H NMR (300 MHz, CD$_3$OD, ppm): δ 7.62-8.03 (m, 12H), 2.14-2.20 (m, 20H), 1.00-1.49 (m, 76H), 0.74-1.00 (m, 28H).

Figure 2:
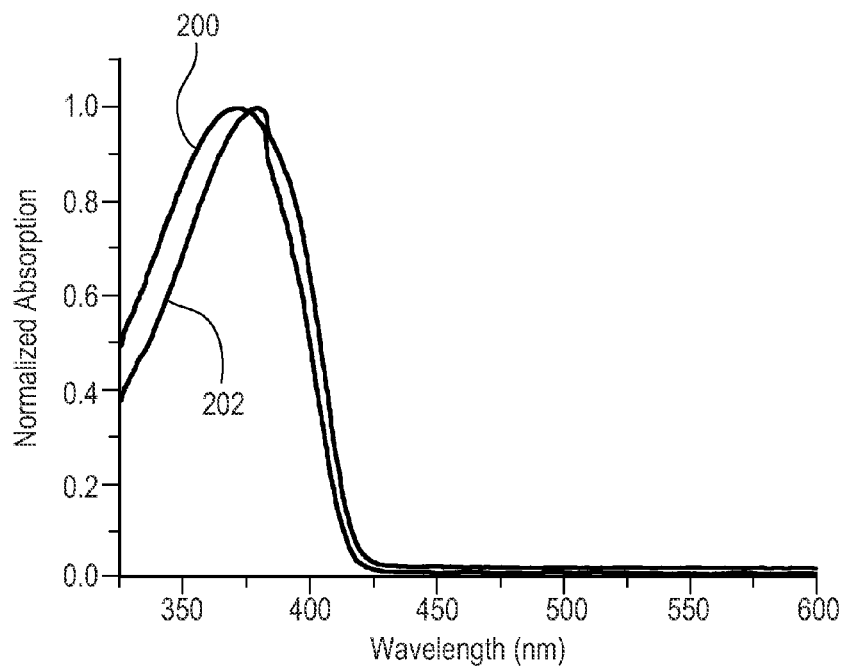
FIG. 2, on coordinates of normalized absorption and wavelength (in nm) is an absorption plot of two example copolymers in solution.
Figure 3:
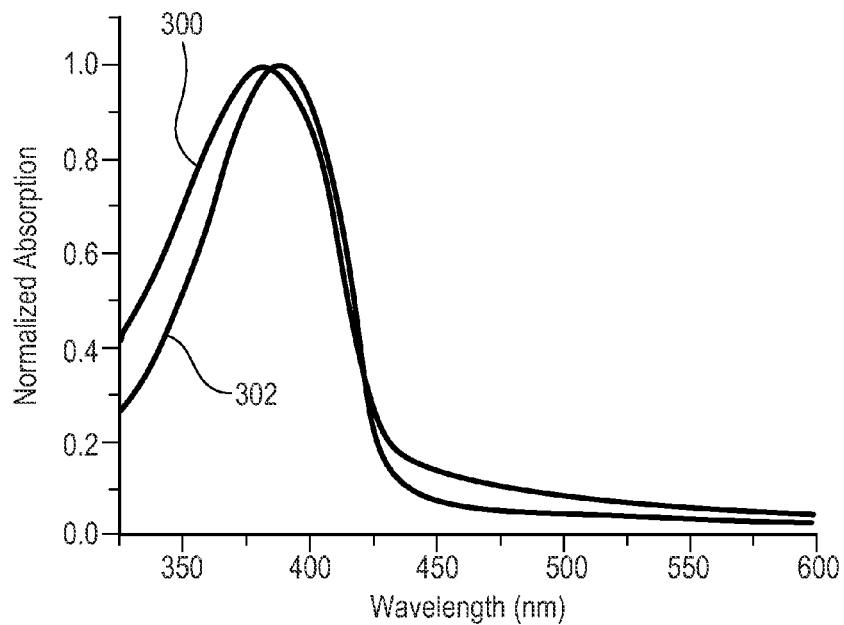
FIG. 3, on coordinates of normalized absorption and wavelength (in nm) is an absorption plot of two example copolymers as a thin film.

The molecular weights $M_n$ (number average) of these copolymers P1 and P2 were 28,920 and 17,115, respectively, while $M_w$ (weight average) were determined to be 46,382 and 37,208, respectively. The polydispersities (PDI) were found to be 1.60 and 2.17, respectively. The absorption of these two polymers P1 and P2 have been measured in both solution (10$^{-5}$ mol/L concentration) and film. The maximum absorption of P1 and P2 were, respectively, 370 nm and 380 nm in solution and 380 and 388 nm in the film. FIG. 2 depicts the absorption plots of P1 (Curve 200) and P2 (Curve 202) in solution. FIG. 3 depicts the absorption plots of P1 (Curve 300) and P2 (Curve 302) in films. Copolymers P1 and P2 both exhibited about 10 nm red shifts.

Cyclic voltammograms (CVs) of films of the copolymers coated on carbon electrodes in 0.1 mol/L Bu$_4$NPF$_6$, CH$_3$CN solution were measured. Based on these CV and the absorption data, the bandgap and HOMO-LUMO energy level may be obtained. For copolymer P1, the energy level of HOMO was determined to be −5.18 eV, that of LUMO was determined to be −2.55 eV, and the energy bandgap was determined to be 2.63 eV. For copolymer P2, the energy level of HOMO was −5.30 eV, that of LUMO was −2.56 eV, and the energy bandgap was 2.74 eV. The HOMO energy level of these polymers indicates that these polymers could be used as good hole transport materials.

Formulation of OPC Coating Solutions:

The solvent mixture may include at least one solvent in which the monomer(s) and dopant(s) are both soluble in. Once the monomer(s) and dopant(s) are selected, then an appropriate solvent may be selected. Examples of monomer(s), dopant(s), and solvent(s) are shown in the following examples. Those are just some representative examples, and are not exhaustive of all possible combinations. Based on the teachings herein, a person of ordinary skill in the art can make appropriate selections of these components.

The following examples are used to illustrate aspects of the invention.

Example 7

Preparation of OPC Coating Formulation 1

To a 100 ml bottle were added N-vinylpyrrolidone (55 mg), ethoxylated bisphenol A dimethylacrylate (150 mg), trimethylolpropane trimethylacrylate (200 mg), tert-butoxy-3,5,7-trimethylhexanoate (20 mg), fluorene-based copolymer 1 (P1) (60 mg), isopropanol (25 mL), and hexafluoro-isopropanol (25 mL). The resulting mixture was shaken for one hour. The formulation was ready for use as a high performance OPC coating.

Example 8

Preparation of OPC Coating Formulation 2

To a 100 ml bottle were added N-vinylpyrrolidone (55 mg), ethoxylated bisphenol A dimethylacrylate (150 mg), trimethylolpropane trimethylacrylate (200 mg), tert-butoxy-3,5,7-trimethylhexanoate (20 mg), fluorene-based copolymer 1 (P2) (60 mg), isopropanol (25 mL), and hexafluoro-isopropanol (25 mL). The resulting mixture was shaken for one hour. The formulation was ready for use as a high performance OPC coating.

Example 9

Preparation of OPC Coating Formulation 3

To a 100 ml bottle were added Norland 83 H (180 mg) (Norland 83 H is a commercially available product from Nordland Products that includes monomers, cross-linkers, and initiator), fluorene-based copolymer 1 (P2) (30 mg), isopropanol (25 mL), and hexafluoro-isopropanol (25 mL). The resulting mixture was shaken for one hour. The formulation was ready for use as a high performance OPC coating.

Example 10

Preparation of OPC Coating Formulation 4

To a 100 ml bottle were added Norland 85 (180 mg) (Norland 85 is a commercially available product from Nordland Products that includes monomers, cross-linkers, and initiator), fluorene-based copolymer 1 (P2) (30 mg), isopropanol (25 mL), and hexafluoro-isopropanol (25 mL). The resulting mixture is shaken for one hour. The formulation is ready for use as a high performance OPC coating.

Example 11

Preparation of OPC Coating Formulation 5

To a 100 ml bottle were added N-vinylpyrrolidone (55 mg), ethoxylated bisphenol A dimethylacrylate (150 mg), trimethylolpropane trimethylacrylate (200 mg) and tert-butoxy-3,5,7-trimethylhexanoate (20 mg), carbazole-based copolymer 2 (see Scheme 2) (60 mg), isopropanol (25 mL), and hexafluoro-isopropanol (25 mL). The resulting mixture is shaken for one hour. The formulation is ready for use as a high performance OPC coating.

Example 12

Preparation of OPC Coating Formulation 6

To a 100 ml bottle were added Norland 81 (180 mg) (Norland 81 is a commercially available product from Nordland Products that includes monomers, cross-linkers, and initiator), carbazole-based copolymer 2 (see Scheme 2) (60 mg), isopropanol (25 mL), and hexafluoro-isopropanol (25 mL). The resulting mixture is shaken for one hour. The formulation is ready for use as a high performance OPC coating.

Example 13

Preparation of OPC Coating Formulation 7

To a 100 ml bottle were added N-vinylpyrrolidone (55 mg), ethoxylated bisphenol A dimethylacrylate (150 mg), trimethylolpropane trimethylacrylate (200 mg), tert-butoxy-3,5,7-trimethylhexanoate (20 mg), benzothiadiazole-based copolymer 3 (see Scheme 3) (60 mg), isopropanol (25 mL), and hexafluoro-isopropanol (25 mL). The resulting mixture is shaken for one hour. The formulation is ready for use as a high performance OPC coating.

Example 14

Preparation of OPC Coating Formulation 8

To a 100 ml bottle were added Norland 78 (180 mg) (Norland 78 is a commercially available product from Nordland Products that includes monomers, cross-linkers, and initiator), benzothiadiazole-based copolymer 3 (see Scheme 3) (60 mg), isopropanol (25 mL), and hexafluoro-isopropanol (25 mL). The resulting mixture is shaken for one hour. The formulation is ready for use as a high performance OPC coating.

Example 15

Preparation of OPC Coating Formulation 9

To a 100 ml bottle were added N-vinylpyrrolidone (55 mg), ethoxylated bisphenol A dimethylacrylate (150 mg), trimethylolpropane trimethylacrylate (200 mg), tert-butoxy-3,5,7-trimethylhexanoate (20 mg), phenothiazine-based copolymer 4 (see Scheme 4) (60 mg), isopropanol (25 mL), and hexafluoro-isopropanol (25 mL). The resulting mixture is shaken for one hour. The formulation is ready for use as a high performance OPC coating.

Example 16

Preparation of OPC Coating Formulation 10

To a 100 ml bottle were added Norland 84 (180 mg) (Norland 84 is a commercially available product from Nordland Products that includes monomers, cross-linkers, and initiator), phenothiazine-based copolymer 4 (see Scheme 4) (60 mg), isopropanol (25 mL), and hexafluoro-isopropanol (25 mL).

The resulting mixture is shaken for one hour. The formulation is ready for use as a high performance OPC coating.

Example 17

Preparation of OPC Coating Formulation 11

To a 100 ml bottle were added N-vinylpyrrolidone (55 mg), ethoxylated bisphenol A dimethylacrylate (150 mg), trimethylolpropane trimethylacrylate (200 mg), tert-butoxy-3,5,7-trimethylhexanoate (20 mg), diaminocarbazole-based copolymer 5 (see Scheme 5) (60 mg), isopropanol (25 mL), and hexafluoro-isopropanol (25 mL). The resulting mixture is shaken for one hour. The formulation is ready for use as a high performance OPC coating.

Example 18

Preparation of OPC Coating Formulation 12

To a 100 ml bottle were added Norland NEA 121 (180 mg) (Norland NEA 121 is a commercially available product from Nordland Products that includes monomers, cross-linkers, and initiator), diaminocarbazole-based copolymer 5 (see Scheme 5) (60 mg), isopropanol (25 mL), and hexafluoro-isopropanol (25 mL). The resulting mixture is shaken for one hour. The formulation is ready for use as a high performance OPC coating.

Example 19

Preparation of OPC Coating Formulation 13

To a 100 ml bottle were added N-vinylpyrrolidone (55 mg), ethoxylated bisphenol A dimethylacrylate (150 mg), trimethylolpropane trimethylacrylate (200 mg), tert-butoxy-3,5,7-trimethylhexanoate (20 mg), 1,4-diphenylaminobenzene-based copolymer 6 (see Scheme 6) (60 mg), isopropanol (25 mL), and hexafluoro-isopropanol (25 mL). The resulting mixture is shaken for one hour. The formulation is ready for use as a high performance OPC coating.

Example 20

Preparation of OPC Coating Formulation 14

To a 100 ml bottle were added Norland NOA 88 (180 mg) (Norland NOA 88 is a commercially available product from Nordland Products that includes monomers, cross-linkers, and initiator), 1,4-diphenylaminobenzene-based copolymer 6 (see Scheme 6) (60 mg), isopropanol (25 mL), and hexafluoro-isopropanol (25 mL). The resulting mixture is shaken for one hour. The formulation is ready for use as a high performance OPC coating.

Example 21

Preparation of OPC Coating Formulation 15

To a 100 ml bottle were added N-vinylpyrrolidone (55 mg), ethoxylated bisphenol A dimethylacrylate (150 mg), trimethylolpropane trimethylacrylate (200 mg), tert-butoxy-3,5,7-trimethylhexanoate (20 mg), bisphenylbenzidine-based copolymer 7 (see Scheme 7) (60 mg), isopropanol (25 mL), and hexafluoro-isopropanol (25 mL). The resulting mixture is shaken for one hour. The formulation is ready for use as a high performance OPC coating.

Example 22

Preparation of OPC Coating Formulation 16

To a 100 ml bottle were Norland NBA 108 (180 mg) (Norland NBA 108 is a commercially available product from Nordland Products that includes monomers, cross-linkers, and initiator), bisphenylbenzidine-based copolymer 7 (see Scheme 7) (60 mg), isopropanol (25 mL), and hexafluoro-isopropanol (25 mL). The resulting mixture is shaken for one hour. The formulation is ready for use as a high performance OPC coating.

The afore-described protective layer concept has been tested using several selected ingredients. A protective coating was deposited on an HP Indigo photoconductor (HP Indigo 5000 series OPC), cross-linked using either UV or thermal treatment, and then used to print multiple pages. Its scratch resistance was determined using a commercial scratch tester and its behavior was monitored during the prolonged printing.

The following examples demonstrate applicability of the afore-described materials for protective coating of an OPC:

(1) $V_{light}$ Measured on a Partially Coated OPC.

Table I below demonstrates the necessity of using a toluene-free coating.

The measured coating was fabricated by depositing a liquid mixture, drying coating (solvent evaporated), and cross-linking by oven annealing 80° C./1.5 hrs. All $V_{light}$ tests were conducted using 5500 HP Indigo press equipped with an external and machine-internal voltage OPC probes.

TABLE I

| Processing | $V_{light}$ (e) | $V_{light}$(ref) (f) |
|---|---|---|
| Toluene only (a) | −232 V | −76 V |
| Coated - toluene-based solution (b) | −284 V | −85 V |
| IPA only (c) | −87 V | −84 V |
| Coated - IPA-based solution described herein (d) | −90 V | −88 V |

Notes:
(a) OPC sprayed with toluene, dried, and then tested for $V_{light}$.
(b) OPC partially coated with toluene-based polymer - CTM mixture (all components are soluble in toluene, all components are commercially available). Components/process details: components: toluene-soluble CTMs, cross-linkers in toluene; process: precursor mixture; deposited with a dropper and spread with Gardco roller to provide a uniform coating. Solvent evaporated and cross-linked in an oven (80° C./90 min - heat treatment. Coating thickness after cross-linking was approx. 1.3 μm.
(c) OPC sprayed with IPA, dried, and then tested for $V_{light}$ (HP Indigo 5500 press).
(d) OPC partially coated with IPA-based mixture described in this disclosure. For components and process details, see examples above: components: as described herein; process: processing details as in (b).
(e) $V_{light}$ was measured with a probe (not internal press probe) within the coated region; this probe may exhibit a small voltage shift as observed in the case of $V_{light}$ (ref) ($V_{light}$ of a "fresh" uncoated OPC is about −70 V to −80 V, which may be about 5 V to 15 V lower than measured by press internal probe) due to difference in distance from the OPC. This magnitude of variations of the $V_{light}$ value can be considered as negligible.
(f) $V_{light}$ was measured within the uncoated area adjacent to the coated region (approximately 20 cm away from the coating boundary) after printing approximately 100 imprints.

(2) Effect of Extended Printing (up to 300K Imprints) on $V_{light}$.

Figure 4:
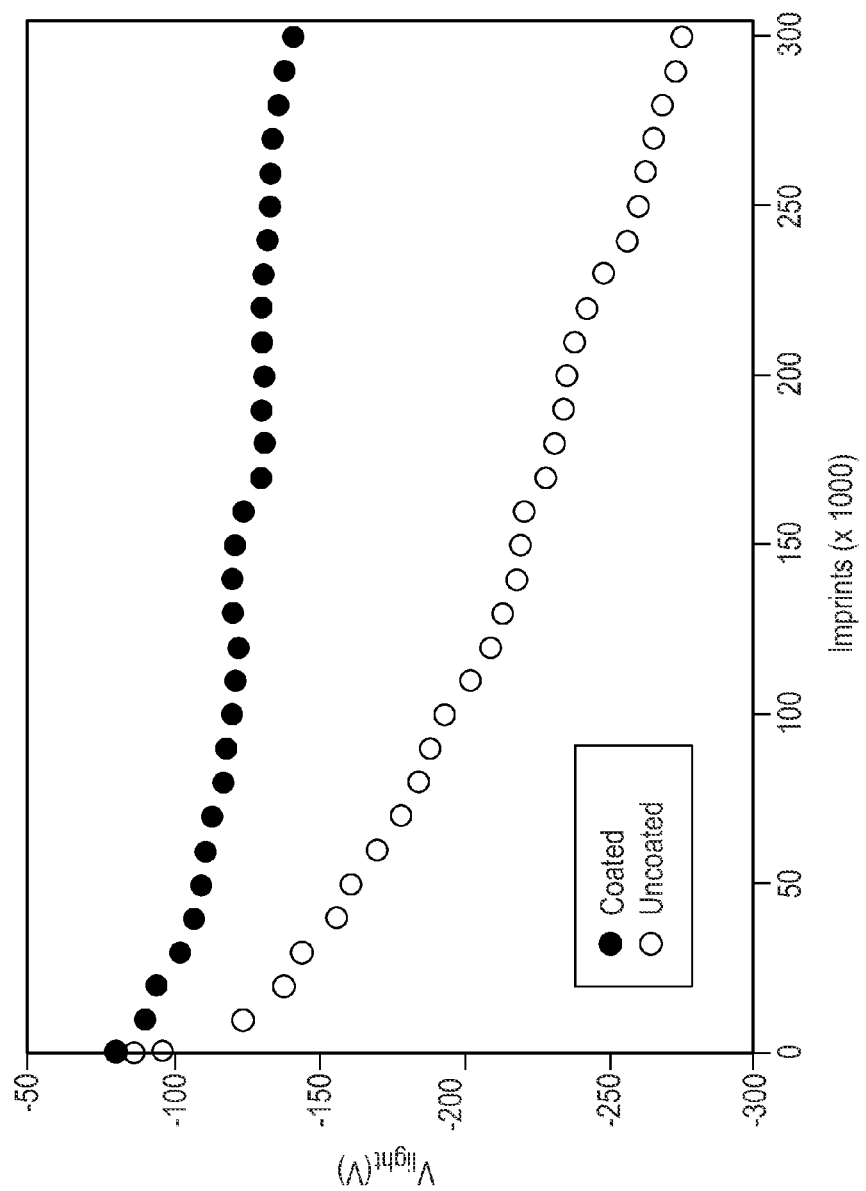
FIG. 4, on coordinates of $V_{light}$ (in volts) and number of imprints, is a plot of degradation as the OPC ages, comparing an uncoated and a coated OPC, where the coating is an example coating.
Figure 5:
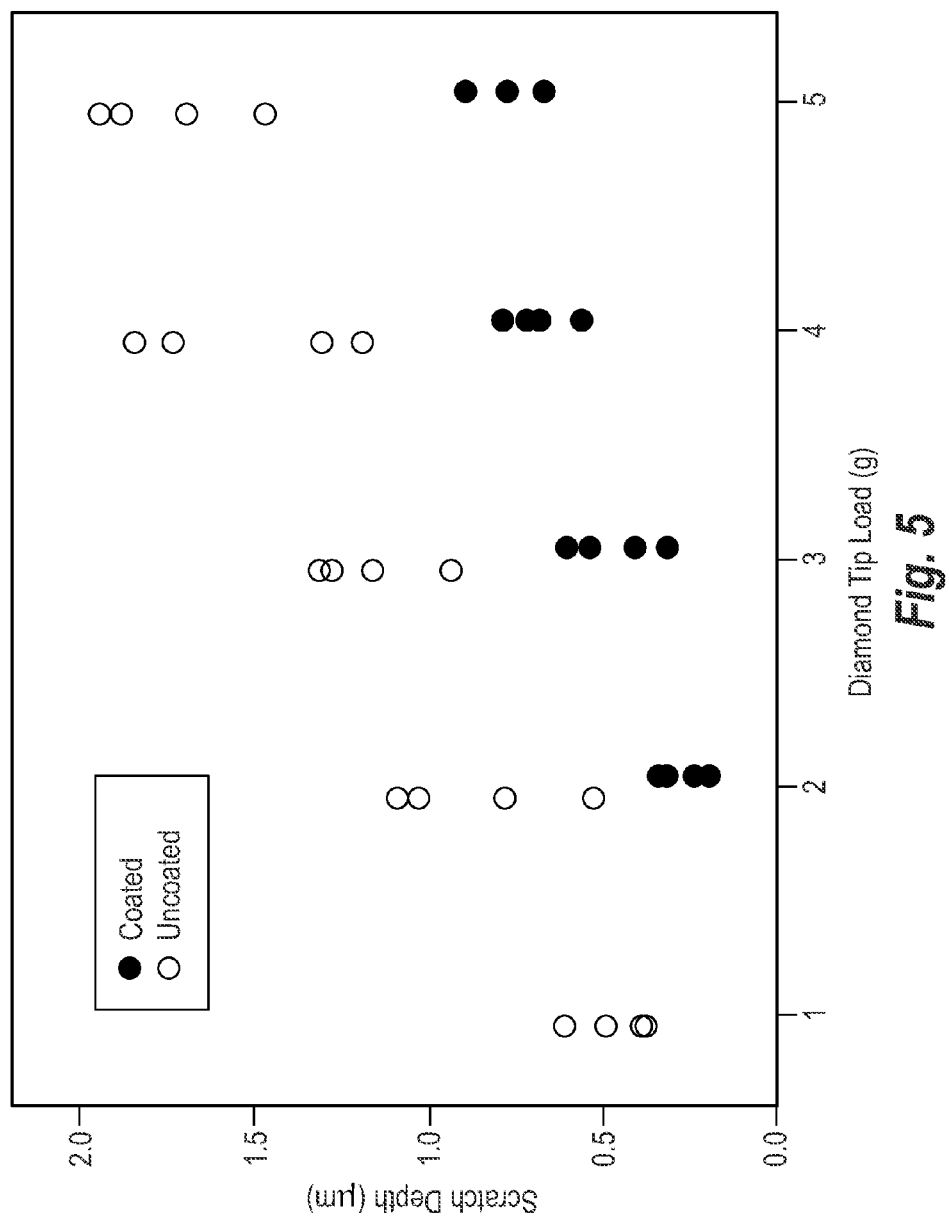
FIG. 5, on coordinates of scratch depth (in μm) and load (in g) is a plot of scratch resistance as a function of load, comparing an uncoated and a coated OPC, where the coating is an example coating.

The measured $V_{light}$ in Table I was found to exhibit gradual degradation during an extended printing; see FIG. 4 (the P1 copolymer was used). Extended printing caused gradual increase of the $V_{light}$ until its value became too high to provide an acceptable print quality. FIG. 4 demonstrates that OPC coating can delay this degradation, thereby permitting more imprints without changing the OPC. The disclosed coating solution was applied as described below.

In one example, the mixture was sprayed on the photoconductor and then wiped with a blade, providing a uniform liquid coating. Then, the coating was allowed to dry and polymerized with a lamp emitting a mixture of UV-A and UV-B radiation.

Other examples of coating the OPC with the mixture were also tried, including (1) the mixture was sprayed and allowed to dry followed by UV polymerization and (2) the mixture was sprayed on the photoconductor, allowed to dry, and thermally polymerized in an oven using air ambient (80° C.) and an annealing time of up to 3 hrs. In this last example, wiping the freshly sprayed mixture with a blade was employed. All of the foregoing examples of coating the OPC were successful.

(3) Scratch Resistance.

Since micro-scratches are considered by the primary reason for OPC failure during an extended printing, increasing the "mechanical strength" (less likely to be scratched) can be considered as one of desired deliverables of the disclosed OPC coating. In present test, both the coated and uncoated OPC were subjected to a controlled scratching using a Taber scratch tester. In this test, a diamond point was used to scratch surface of the OPC in a "gramophone record" pattern (OPC rotating continuously for 1 min—multiple rotations, various weight load pressing the diamond point against the OPC were tested). Then, depth of the scratch was measured with a Dektak profiler. Depth of the scratch can be considered as a test of "scratch resistance" of the OPC (shallower scratch means better scratch resistance). FIG. 5 shows the results for the uncoated OPC and the OPC coated with the example coating. It can be seen that the coated OPC has superior scratch resistance, compared to the uncoated OPC.

(4) Effect of Extended Printing (up to 300K Imprints) on the Optical Density.

Figure 6:
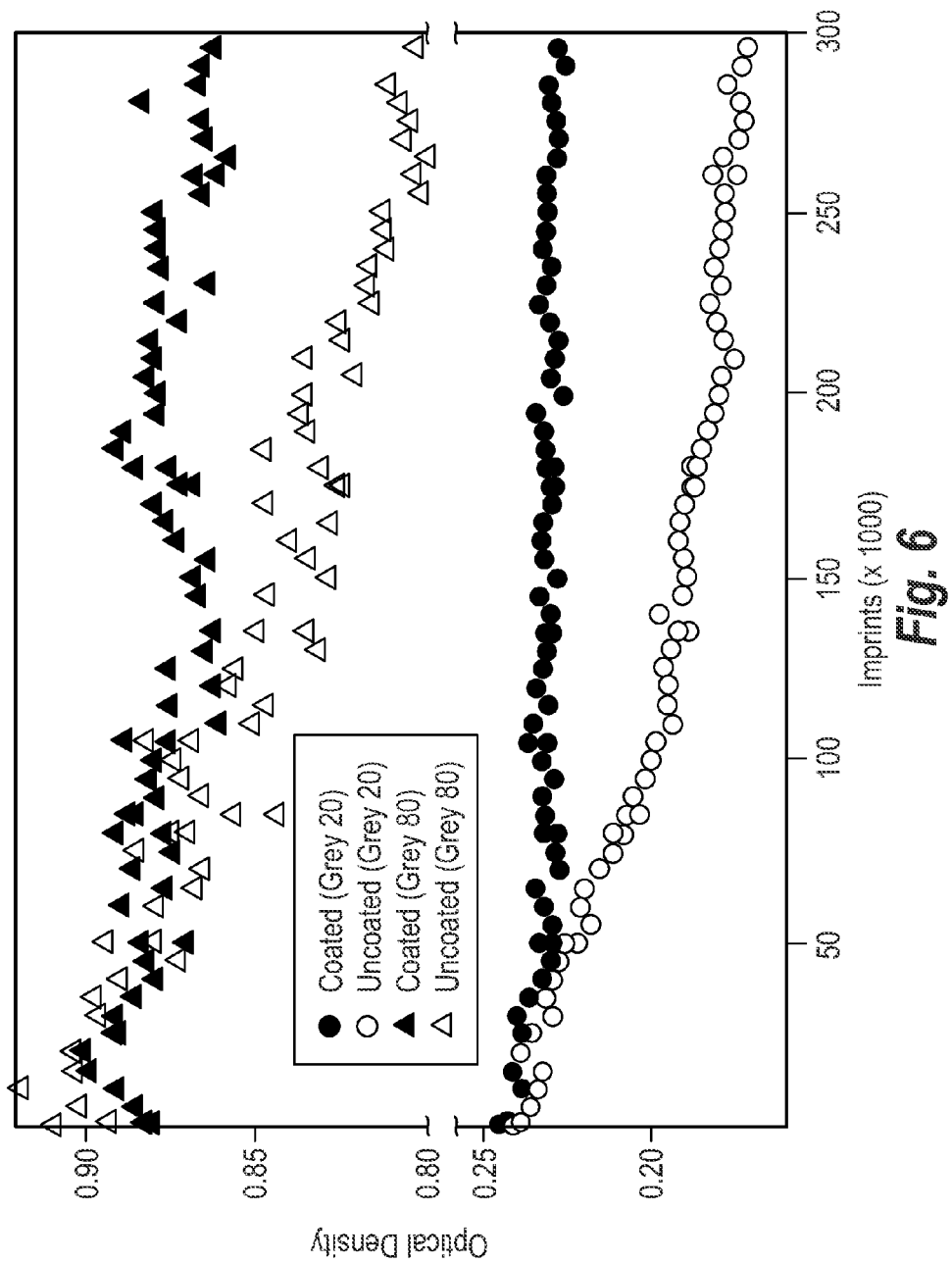
FIG. 6, on coordinates of optical density and number of imprints, is a plot of the change in optical density as a function of imprints, comparing an uncoated and a coated OPC, where the coating is an example coating.
Figure 7:
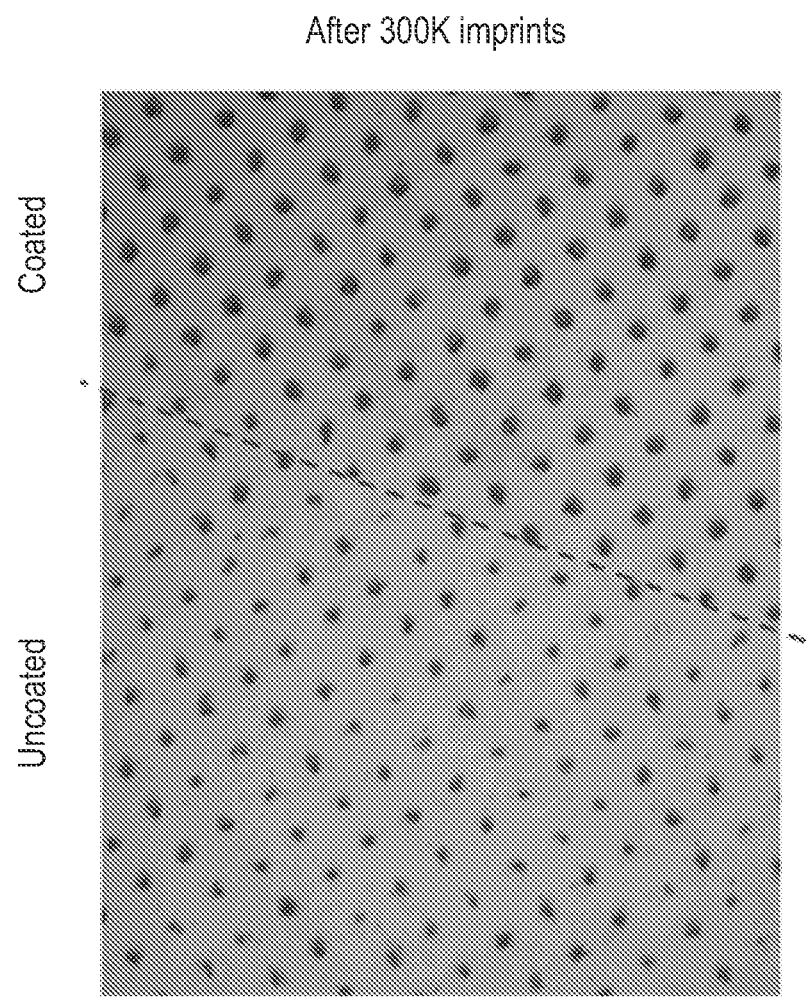
FIG. 7 demonstrates shrinkage of printed features during an extended printing, and the ways that an example OPC coating can prevent the shrinkage.

FIG. 6 exhibits the variation of optical density (OD) as a function of the number of imprints (continuous printing process was used) for the cases of light (Grey 20=20% printed area covered with ink dots) and heavy (Grey 80=80% of printed area covered with ink dots) ink coverage (the OD was measured with an XRite 500 spectrodensitometer). The OD decrease within the uncoated region is mostly due to gradual dot size shrinkage caused by OPC degradation. FIG. 7 provides a comparison of dots in coated and uncoated regions after 300K imprints, wherein dots in the uncoated region can be seen to be decreased and non-uniform in size and density as compared with dots in the coated region.

Negligible OD degradation was observed within the regions covered with a protective film (the P1 copolymer was used). Retaining the desired OD after an extended printing requires optimization of the CTM concentration within the coating mixture. The best OD results were obtained when the CTM concentration using the P1 copolymer was between 4 and 7 wt % of NVS (non-volatile solids constituting the alcohol-based coating mixture). Higher or lower dopant concentration caused degradation of the OD after an extended printing. It will be appreciated that the example range of 4 to 7 wt % obtains for the P1 copolymer in the solutions tested. The combination of copolymer P1 in other solutions and other copolymers in other solutions may have different concentration ranges of optimum performance, and such a determination is readily within the ability of the person skilled in the art to make without undue experimentation.

What is claimed is:

1. An organic coating formed on a surface of an organic photoconductor, the coating comprising an alcohol-soluble hole transport material embedded in an in-situ cross-linked polymer, wherein the hole transport material is a cationic alternate fluorene-based copolymer with phosphonium salt terminal groups.

2. The organic coating of claim 1 comprising a copolymer selected from the group consisting of fluorene copolymers with phosphonium salt terminal groups and dialkyl substituted fluorene derivatives; fluorene copolymers with phosphonium salt terminal groups and substituted carbazole derivatives; fluorene copolymers with phosphonium salt terminal groups and substituted benzothiadiazole derivatives; fluorene copolymers with phosphonium salt terminal groups and substituted phenothiazine derivatives; fluorene copolymers with phosphonium salt terminal groups and substituted 2,7-diaminocarbazole derivatives; fluorene copolymers with phosphonium salt terminal groups and substituted 1,4-diphenylaminobenzene derivatives; and fluorene copolymers with phosphonium salt terminal groups and substituted bisphenylbenzidine derivatives.

3. The coating of claim 1 wherein the organic photoconductor comprises a substrate, a charge generation layer on the substrate, a charge transport layer on the charge generation layer, and the organic coating on the charge transport layer.

4. A process for forming the organic coating on the surface of the organic photoconductor of claim 1, the process including:
forming a solution including a cross-linkable monomer, oligomer, or polymer, a cross-linking agent, an initiator, a cationic alternate fluorene-based copolymer with phosphonium salt terminal groups, and an alcohol-based solvent;
applying the solution to the surface of the organic photoconductor; and
cross-linking the solution in-situ on the surface, to form the fluorene-based copolymer embedded in an in-situ cross-linked polymer.

5. The process of claim 4 wherein the cross-linkable monomer, oligomer, or polymer is selected from the group consisting of N-alkyl acrylamides, N-aryl acrylamides and N-alkoxyalkyl acrylamides, the corresponding methacrylamides, N-vinyl amides, N-vinyl cyclic amides, heterocyclic vinyl amines, polyethylene glycolated acrylates, polyethylene glycolated methacrylates, cationic monomers, and combinations thereof.

6. The process of claim 4 wherein the cross-linking agent is selected from the group consisting of 2-branch, 3-branch, and 4-branch cross-linkers that can be initiated with energy provided by UV or heat.

7. The process of claim 4 wherein the initiator is selected from the group consisting of photo-activated initiators and thermally-activated initiators.

8. The process of claim 4 wherein the fluorene-based copolymer is selected from the group consisting of fluorene copolymers with phosphonium salt terminal groups and dialkyl substituted fluorene derivatives; fluorene copolymers with phosphonium salt terminal groups and substituted carbazole derivatives; fluorene copolymers with phosphonium salt terminal groups and substituted benzothiadiazole derivatives; fluorene copolymers with phosphonium salt terminal groups and substituted phenothiazine derivatives; fluorene copolymers with phosphonium salt terminal groups and substituted 2,7-diaminocarbazole derivatives; fluorene copolymers with phosphonium salt terminal groups and substituted 1,4-diphenylaminobenzene derivatives; and fluorene copolymers with phosphonium salt terminal groups and substituted bisphenylbenzidine derivatives.

9. The process of claim 4 in which the alcohol-based solvent is selected from the group consisting of methanol, ethanol, propanol, iso-propanol, butanol, 2-butanol, tert-butanol, pentanol, hexanol, their perfluorinated analogs, and mixtures thereof.

10. The process of claim 4 wherein the solution includes:
0.1 to 40 wt % cross-linkable monomer, oligomer, or polymer;
0.1 to 50 wt % cross-linking agent;
0.1 to 20 wt % initiator;
0.05 to 40 wt % cationic alternate fluorene-based copolymer with phosphonium salt terminal groups; and
0.1 to 20 wt % alcohol-based solvent.

11. Alcohol-soluble cationic alternate fluorene-based copolymers with phosphonium salt terminal groups.

12. The fluorene-based copolymers of claim 11 having a structure selected from the group consisting of:
fluorene copolymers with phosphonium salt terminal groups and dialkyl substituted fluorene derivatives:

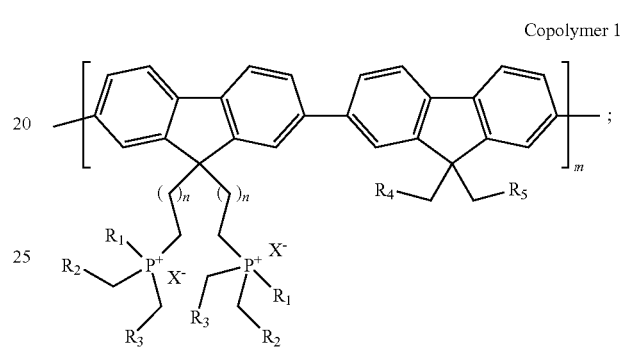

Copolymer 1 fluorene copolymers with phosphonium salt terminal groups and substituted carbazole derivatives:

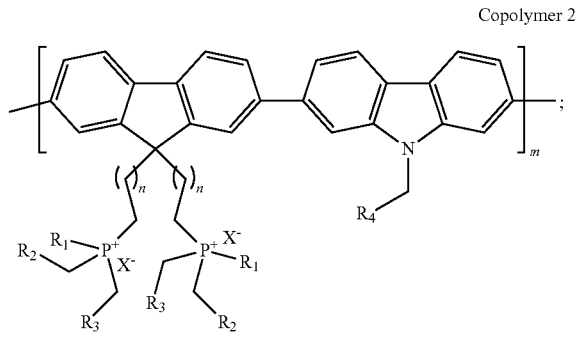

Copolymer 2 fluorene copolymers with phosphonium salt terminal groups and substituted benzothiadiazole derivatives:

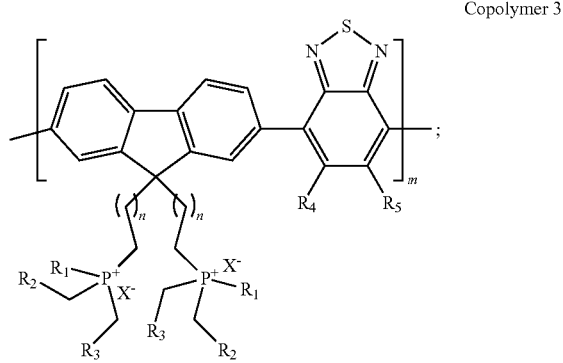

Copolymer 3 fluorene copolymers with phosphonium salt terminal groups and substituted phenothiazine derivatives:

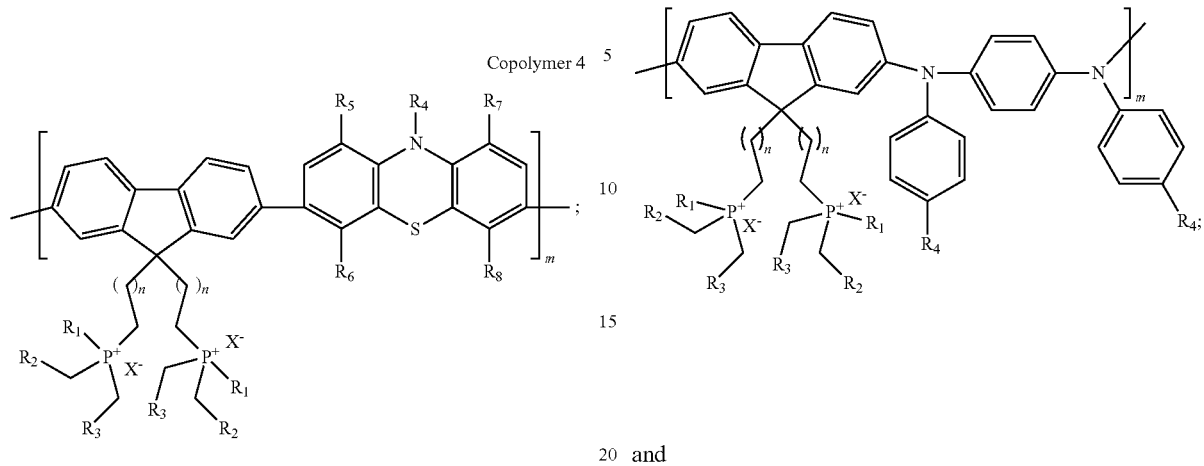

fluorene copolymers with phosphonium salt terminal groups and substituted 2,7-diaminocarbazole derivatives:

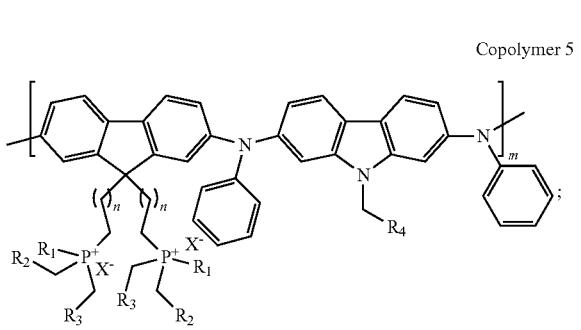

fluorene copolymers with phosphonium salt terminal groups and substituted 1,4-diphenylaminobenzene derivatives:

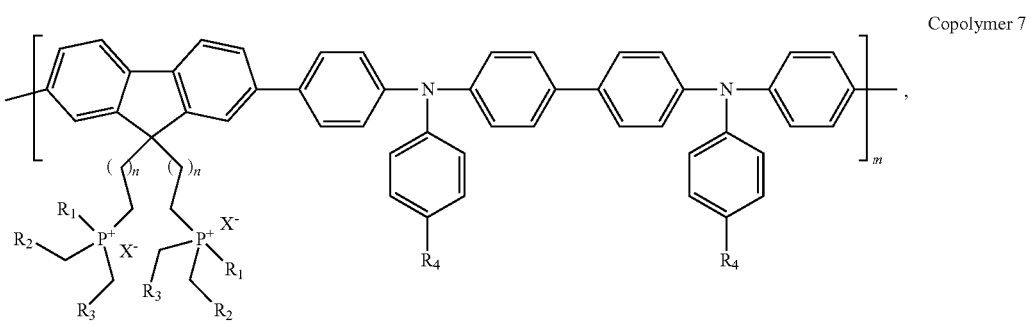

and fluorene copolymers with phosphonium salt terminal groups and substituted bisphenylbenzidine derivatives:

wherein:
R$_1$, R$_2$, R$_3$, R$_4$, and R$_5$ are each independently selected from the group consisting of C1-C30 alkyl, C1-C30 alkenyl, C1-C30 alkynyl, C1-C30 aryl, C1-C30 alkoxy, C1-C30 phenoxy, C1-C30 thioalkyl, C1-C30 thioaryl, C(O)OR$_6$, N(R$_7$)(R$_8$), C(O)N(R$_9$)(R$_{10}$), F, Cl, Br, NO$_2$, CN, acyl, carboxylate and hydroxy, wherein R$_6$, R$_7$, R$_8$, R$_9$ and R$_{10}$ are each independently selected from the group consisting of hydrogen, C1-C30 alkyl and C1-C30 aryl, and so forth. R$_1$, R$_2$, R$_3$, R$_4$, R$_5$, R$_6$, R$_7$, R$_8$ and R$_9$ may be the same or different;
n is an integer between 1 and 30;
m is an integer between 1 and 5,000; and
X represents an anion selected from the group consisting of Br$^-$, Cl$^-$, I$^-$, tetrafluoroborate, and tetraphenyl borate.

13. The fluorene-based copolymers of claim 11 wherein the copolymers are soluble in an alcohol selected from the group consisting of methanol, ethanol, propanol, iso-propanol, butanol, 2-butanol, tert-butanol, pentanol, hexanol, their perfluorinated analogs, and mixtures thereof.

14. An organic photoconductor comprising a substrate, a charge generation layer formed on the substrate, a charge transport layer formed on the charge generation layer, and a protective coating on the charge transport layer, the protective coating comprising a cationic alternate fluorene-based copolymer with phosphonium salt terminal groups embedded in an in-situ cross-linked polymer.

15. The organic photoconductor of claim 14 wherein the fluorene-based copolymer is selected from the group consisting of fluorene copolymers with phosphonium salt terminal groups and dialkyl substituted fluorene derivatives; fluorene copolymers with phosphonium salt terminal groups and substituted carbazole derivatives; fluorene copolymers with phosphonium salt terminal groups and substituted benzothiadiazole derivatives; fluorene copolymers with phosphonium salt terminal groups and substituted phenothiazine derivatives; fluorene copolymers with phosphonium salt terminal groups and substituted 2,7-diaminocarbazole derivatives; fluorene copolymers with phosphonium salt terminal groups and substituted 1,4-diphenylaminobenzene derivatives; and fluorene copolymers with phosphonium salt terminal groups and substituted bisphenylbenzidine derivatives.

* * * * *